(12) United States Patent
Liu

(10) Patent No.: US 12,140,301 B1
(45) Date of Patent: Nov. 12, 2024

(54) PORTABLE LIGHT UP MIRROR

(71) Applicant: ShaoJia Liu, Shenzhen (CN)

(72) Inventor: ShaoJia Liu, Shenzhen (CN)

( * ) Notice: Subject to any disclaimer, the term of this patent is extended or adjusted under 35 U.S.C. 154(b) by 0 days.

(21) Appl. No.: 18/638,707

(22) Filed: Apr. 18, 2024

(51) Int. Cl.
| | | |
|---|---|---|
| *F21V 33/00* | (2006.01) |
| *A45D 42/10* | (2006.01) |
| *A47G 1/02* | (2006.01) |
| *A47G 1/04* | (2006.01) |
| *F21V 23/04* | (2006.01) |
| *F21Y 107/70* | (2016.01) |
| *F21Y 113/00* | (2016.01) |

(52) U.S. Cl.
CPC ........ *F21V 33/004* (2013.01); *F21V 23/0485* (2013.01); *A45D 42/10* (2013.01); *A47G 1/02* (2013.01); *A47G 1/04* (2013.01); *A47G 2200/08* (2013.01); *F21V 23/0464* (2013.01); *F21Y 2107/70* (2016.08); *F21Y 2113/00* (2013.01)

(58) Field of Classification Search
CPC ............. F21V 23/0485; F21V 23/0464; F21V 33/004; A45D 42/10; F21Y 2107/70; A47G 1/02; A47G 1/04; A47G 2200/08
See application file for complete search history.

(56) References Cited

U.S. PATENT DOCUMENTS

| | | | | |
|---|---|---|---|---|
| 6,785,062 B1 * | 8/2004 | Daley | .................... | A45D 42/16 |
| | | | | 359/802 |
| 8,356,908 B1 * | 1/2013 | Zadro | ................... | F21V 33/004 |
| | | | | 362/135 |
| 2016/0341415 A1 * | 11/2016 | Lumaye | .................... | A47G 1/02 |
| 2018/0231235 A1 * | 8/2018 | Reynolds | ............... | A47B 13/16 |
| 2019/0246772 A1 * | 8/2019 | Yang | ....................... | A45D 42/10 |

FOREIGN PATENT DOCUMENTS

| | | | |
|---|---|---|---|
| CN | 2319849 Y | * | 5/1999 |
| CN | 203734651 U | * | 7/2014 |

OTHER PUBLICATIONS

Machine translation of CN 203734651 U retrieved from the FIT database of PE2E search. (Year: 2024).*
Machine translation of CN 2319849 Y retrieved from the FIT database of PE2E search. (Year: 2024).*

* cited by examiner

*Primary Examiner* — Colin J Cattanach
(74) *Attorney, Agent, or Firm* — Ying-Ting Chen

(57) ABSTRACT

A portable light up mirror includes a mirror element, a case element for installing the mirror element, a cover element which is coupled with the case element for covering the mirror element, and a light source which is arranged behind the mirror element within the case element for providing even and glare-free illumination, so that the adequate lighting minimizes shadows on a user's face and give the user a more accurate view when grooming or applying cosmetics.

3 Claims, 19 Drawing Sheets

PORTABLE LIGHT UP MIRROR

BACKGROUND OF THE PRESENT INVENTION

Field of Invention

The present invention relates to a mirror device, and more particularly to a portable light up mirror.

Description of Related Arts

A portable mirror is a compact mirror that is designed to be easily carried around. These mirrors are typically small in size, lightweight, and often come with a protective case or cover to prevent damage while being transported. They are convenient for people who need to check their appearance on the go, such as travelers, commuters, or individuals who frequently need to touch up their makeup or grooming throughout the day. Portable mirrors can come in various shapes, sizes, and designs to suit different preferences and need.

A conventional portable makeup mirror, which may be provided with built-in lighting and commonly known as a vanity mirror, is a specialized mirror designed to provide illumination for applying makeup or grooming tasks. However, the conventional lighting arrangement in the mirror may either provide a glare illumination, or unsatisfied illumination which leads to shadows or uneven lighting that may affect makeup application or grooming tasks.

In addition, the conventional portable mirrors may be more prone to damage due to their smaller size and lightweight construction. Dropping or mishandling the mirror could result in cracks or scratches on the mirror surface, affecting its usability.

Furthermore, most portable conventional mirrors only offer single-angle reflections, which means that the user can only view his or her reflection from one limited angle. This limitation may make it more challenging to achieve certain makeup or grooming tasks that require viewing from multiple angles.

SUMMARY OF THE PRESENT INVENTION

The invention is advantageous in that it provides a portable light up mirror which is capable of providing even and glare-free illumination, so that the adequate lighting minimizes shadows on a user's face and give the user a more accurate view when grooming or applying cosmetics.

Another advantage of the present invention is to provide a portable light up mirror, wherein electronic components are discreetly concealed beneath a mirror element, so as to enhance the overall aesthetic and sleek appearance of the portable light-up mirror for contributing to the mirror's attractiveness and visual appearance.

Another advantage of the present invention is to provide a portable light up mirror, wherein the mirror element is allowed to be supported at different positions, so as to provide the user with the flexibility to view his or her reflection from a preferred desired angle, and this adjustable feature enhances the user experience by accommodating individual preferences and ensuring optimal visibility during use.

Another advantage of the present invention is to provide a portable light up mirror, wherein a simple finger touch of the user can be used to control the operation of the lighting source, and thus this intuitive touch-control feature enhances user convenience and simplifies the design by eliminating the necessity for additional mechanical buttons.

Another advantage of the present invention is to provide a portable light up mirror, wherein the finger touch area is integrated within the mirror element itself, an indication pattern, achieved through laser etching, is strategically placed on the surface of the mirror element to signify the finger touch area. This approach eliminates the need for additional space to accommodate or install a separate control switch on the housing for controlling the lighting source, so that the entire area of the mirror element remains dedicated to reflection, maximizing its functionality and usability.

Another advantage of the present invention is to provide a portable light up mirror, wherein a reinforcing layer is affixed to the mirror element for providing added durability and protection. This reinforcing layer serves to prevent the mirror element from easily sustaining damage or shattering into pieces in the event of the portable light up mirror being dropped onto the ground. Such reinforcement enhances the longevity and resilience of the mirror, ensuring continued functionality and safety for the user.

Another advantage of the present invention is to provide a portable light up mirror which comprises a case element for securely mounting the mirror element. Additionally, a cover element is included to protect the mirror element. When the cover element is in place, a retaining structure ensures the cover element to remain to be firmly attached to the case element, preventing accidental detachment and undesired exposure of the mirror element. This design feature enhances the durability and longevity of the mirror, safeguarding it from potential damage or wear during transportation or storage.

Additional advantages and features of the invention will become apparent from the description which follows, and may be realized by means of the instrumentalities and combinations particularly pointing out in the appended claims.

According to the present invention, the foregoing and other objects and advantages are attained by a portable light up mirror, comprising:

a mirror element;

a case element, wherein the mirror element is mounted in the case element;

a cover element which is coupled with the case element for covering the mirror element; and a light source which is arranged behind the mirror element within the case element.

According to an embodiment, the mirror element comprises a substrate layer and a reflective layer, wherein the substrate layer which is a transparent layer comprises a maid body and an edge portion surrounding the main body, wherein the reflective layer is attached to the substrate layer, wherein the edge portion of the substrate layer comprises a blasted surface for diffusing light beams from the light source.

According to an embodiment, the blasted surface is formed through one of sandblasting process, chemical etching process and engraving process.

According to an embodiment, the blasted surface of the edge portion of said substrate layer is formed at an inner side thereof to scatter the light beams emitted by the light source in various directions to reduce glare, wherein the blasted surface obscures a view through the substrate layer in a manner that the light source is not visible to a user from an outer side of the mirror element while still allows the light beams of the light source to pass therethrough to reach a face of the user.

According to an embodiment, the light source comprises a flexible circuit board and a plurality of light emitting elements attached on the flexible circuit board, wherein the flexible circuit board is attached to the case element to align the plurality of light emitting elements to face towards the blasted surface of the edge portion of the substrate layer.

According to an embodiment, the case element comprises a base board, a mounting frame connected to the base board, and a surrounding wall connected to the base board, wherein an accommodating groove is formed between the mounting frame and the surrounding wall, wherein the light source comprises a flexible circuit board and a plurality of light emitting elements attached on the flexible circuit board, wherein the plurality of light emitting element is disposed in the accommodating groove.

According to an embodiment, the flexible circuit board is attached to the mounting frame within the accommodating groove, wherein each of the light emitting elements comprises a light emitting surface oriented toward the surrounding wall of the case element and a side edge oriented toward the mirror element, so as to allow light beams from each the light emitting element to project onto the surrounding wall of the case element and then are reflected by the surrounding wall towards the edge portion of the substrate layer of the mirror element.

According to an embodiment, the mounting frame comprises a plurality of frame portions and a plurality of bending corners each is formed between two the adjacent frame portions, wherein the flexible circuit board comprises a plurality of side sections and a plurality of transition corners each is formed between two the adjacent side sections, wherein a group of the light emitting elements comprising two or more light emitting elements is attached to each the transition corner of the flexible circuit board corresponding to the bending corner of the mounting frame, so as to prevent formation of dark spots and ensure uniform lighting coverage throughout the edge portion of the substrate layer.

According to an embodiment, the accommodating groove is a ring-shape groove having a plurality of corners, wherein two the light emitting elements are arranged on each the transition corner adjacent to a center position of the transition corner of the flexible circuit board, so as to enhance the illumination from each the corner of the accommodating groove.

According to an embodiment, the reflective layer comprises a peripheral edge which is extended to a position above the accommodating groove in a manner that the plurality of light emitting elements is covered by the peripheral edge of the reflective layer, so as to hide the light emitting elements behind the peripheral edge of the reflective layer.

According to an embodiment, the mirror element further comprises a reinforcing layer attached to the reflective layer of the substrate layer, wherein the reinforcing layer comprise one of polyester layer and polyethylene terephthalate layer.

According to an embodiment, the plurality of light emitting elements is hidden behind the reinforcing layer.

According to an embodiment, a control unit is electrically connected to the light source to control operation of the light source, wherein the control unit comprise a circuit board which is integrated with a capacitive touch controller chip, and a capacitive sensing element which is electrically connected to the apacitive touch controller chip to detect a finger touch of a user.

According to an embodiment, the capacitive sensing element comprises an sensing layer attached to the mirror element and a spring abutting against the sensing layer, wherein the spring is an electrical conductor that is electrically connected to the circuit board.

According to an embodiment, the sensing layer is a round copper foil that is attached to a back side of the mirror element, wherein a diameter of the sensing layer is larger than a diameter of the spring, wherein when a finger of the user approaches the mirror element at a position corresponding to the sensing layer, the finger disrupts electromagnetic field around the capacitive sensing element and cause a change in capacitance, and this change is detected by the capacitive touch controller chip, so as to trigger an operation of the light source.

According to an embodiment, the mirror element comprises a substrate layer, a reflective layer attached to the substrate layer, and an indication pattern which is distinguishable from the substrate layer and achieved through laser etching, so as to be aligned with the capacitive sensing element to signify a finger touch area of the mirror element.

According to an embodiment, the case element comprises base board and a pivot base connected to the base board, the cover element comprises a cover board and a pivot arm connected to the cover board, wherein a pivot pin is penetrating the pivot arm and the pivot base to pivotally couple the case element with the cover element.

According to an embodiment, the cover element further comprises a limitation portion inclinedly extended between the pivot arm and the cover board, the case element further comprises a connecting portion inclinedly extended between the pivot base and the base board, wherein the limitation portion comprises an inclined limiting surface and the connecting portion comprises an inclined abutting surface, when the inclined abutting surface is parallel with the inclined limiting surface and is abutting against the inclined limiting surface, the further pivotal movement between the cover element and the case element is stopped, so as to retain the case element in a usage state for exposing the mirror element.

According to an embodiment, the base board of the case element comprises a transverse abutting edge which is bottom edge of the base board when the case element is in a usage state for exposing the mirror element, wherein the transverse abutting edge is abutting against the cover element so as to block the further pivotal movement between the case element and the cover element.

According to an embodiment, the pivot pin comprises a surface texture structure which is embedded in the corresponding pivot base to enhance the frictional contact between the pivot pin and the corresponding pivot base, so as to allow the case element to be supported by the cover element at different inclined positions, rendering the mirror element being supported at various inclination angles.

According to an embodiment, the mirror element comprises one or more magnification mirrors mounted to the base board of the case element at a back side of the base board.

According to an embodiment, the cover element is a foldable cover comprising a plurality of cover sections for supporting the case element at different inclination positions.

According to an embodiment, the cover element comprises a plurality of cover members which is respectively pivotally coupled to lateral sides of the case element, and the plurality of magnification mirrors is respectively attached to the plurality of cover members at the inner sides of the plurality of cover members.

According to an embodiment, the cover element comprises an operation end which is protruded from the cover board for facilitate a user to pull the cover element away from the case element.

According to an embodiment, the cover element comprises a cover board and a hook end which is vertically extended from the cover body for detachably engaging with the case element. The hook end has a hook hole, the surrounding wall of the case element has an engaging groove for receiving the hook end and comprises an engaging pin which is used to be engaged with the hook hole of the hook end, so that when the cover element is overlapping aligned with the mirror element, the engagement between the engaging pin and the hook hole of the hook end will secure the cover element with the case element.

According to an embodiment, the cover element is magnetically attracted to the case element.

According to an embodiment, a supporting base comprising a standing support and a supporting arm extended from the standing support is provided for movably supporting the case element, and the case element is rotatably coupled to the supporting arm, so as to adjust an inclination angle of the mirror element.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
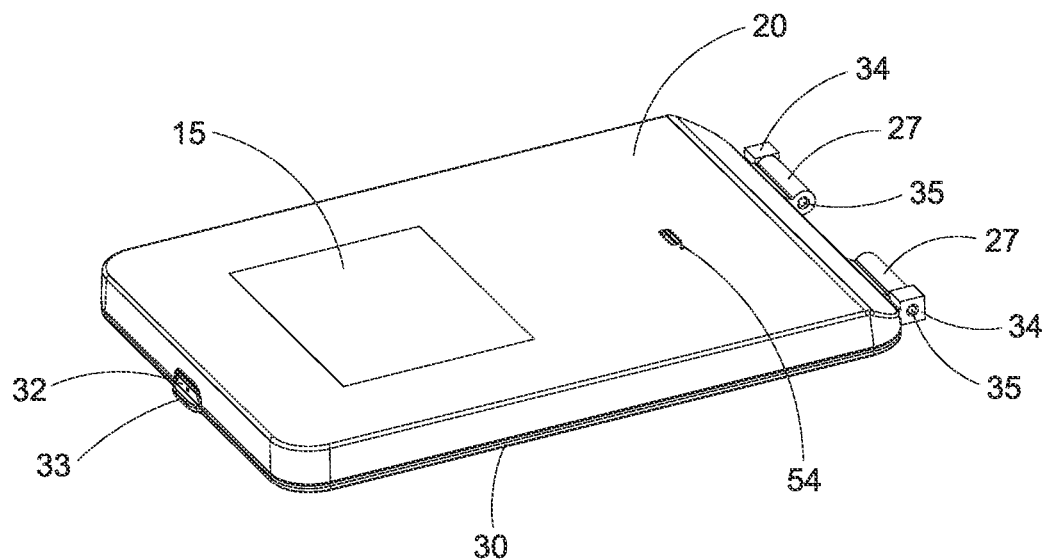
FIG. 1 is a perspective view of a portable light up mirror according to a preferred embodiment of the present invention.
Figure 2:
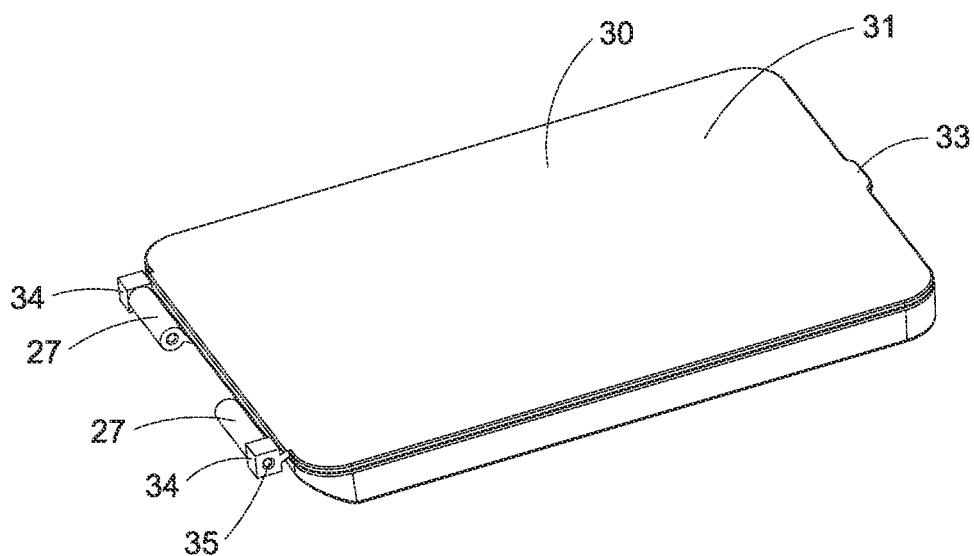
FIG. 2 is another perspective view of the portable light up mirror according to the above preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. that indicate relations of directions or positions are based on the relations of directions or positions shown in the appended drawings, which are only to facilitate descriptions of the present invention and to simplify the descriptions, rather than to indicate or imply that the referred device or element is limited to the specific direction or to be operated or configured in the specific direction. Therefore, the above-mentioned terminologies shall not be interpreted as confine to the present invention.

Referring to FIG. 1 to FIG. 15 of the drawings, a portable light up mirror according to a preferred embodiment of the present invention is illustrated. The portable light up mirror comprises a mirror element 10, a case element 20 for mounting and accommodating the mirror element 10, a cover element 30 coupled with the case element 20 to form a housing for covering and protecting the mirror element 10, a light source 40 for providing illumination to a user's face, and a control unit 50 electrically connected to the light source 40 for controlling the operation of the light source 40.

The mirror element 10 comprises a transparent substrate layer 11, and a reflective layer 12 attached to the substrate layer 11, so as to form a mirror for the user to view his or her face. The substrate layer 11 may be made of glass or acrylic, the reflective layer 12 is a thin layer of high reflectively that is applied to a back surface of the substrate layer 11 for reflecting light. The reflective layer 12 can be a silver layer, an aluminum layer, or an dielectric coating layer. Alternatively, a tin layer may be applied between the transparent layer and the reflective layer 12, so as to help the reflective coating to adhere to the substrate layer 11 and prevent corrosion.

The substrate layer 11 comprises a main body 111 and an edge portion 112, the reflective layer 12 is applied to the back surface of the main body 111 through processes like vacuum deposition or chemical deposition, so as to define a mirror area corresponding to the size and shape of the reflective layer 12. Accordingly, an area of the reflective layer 12 is smaller than an area of the substrate layer 11, and the edge portion 112 is a continual and circular portion arranged around the perimeter of the reflective layer 12 for allowing light beams from the light source 40 to pass therethrough to reach the face of the user.

The mirror element 10 is disposed in the case element 20, so as to be retained in the case element 20. More specifically, the mirror element 10 is attached to the case element 20 to define an inner cavity 201 between the mirror element 10 and the case element 20 for receiving and installing the light source 40 and the control unit 50.

Figure 4:
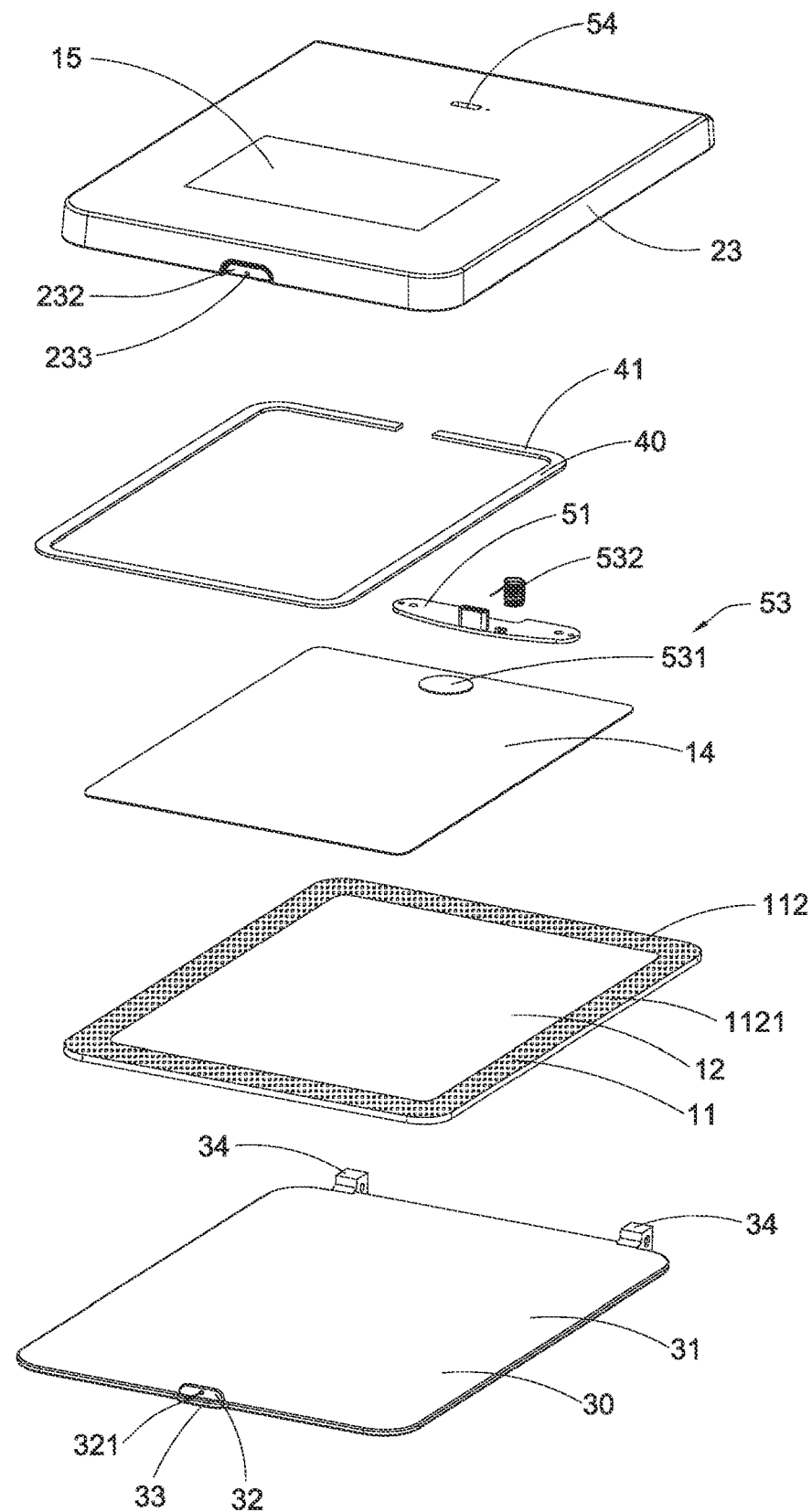
FIG. 4 is an exploded view of the portable light up mirror according to the above preferred embodiment of the present invention.
Figure 5:
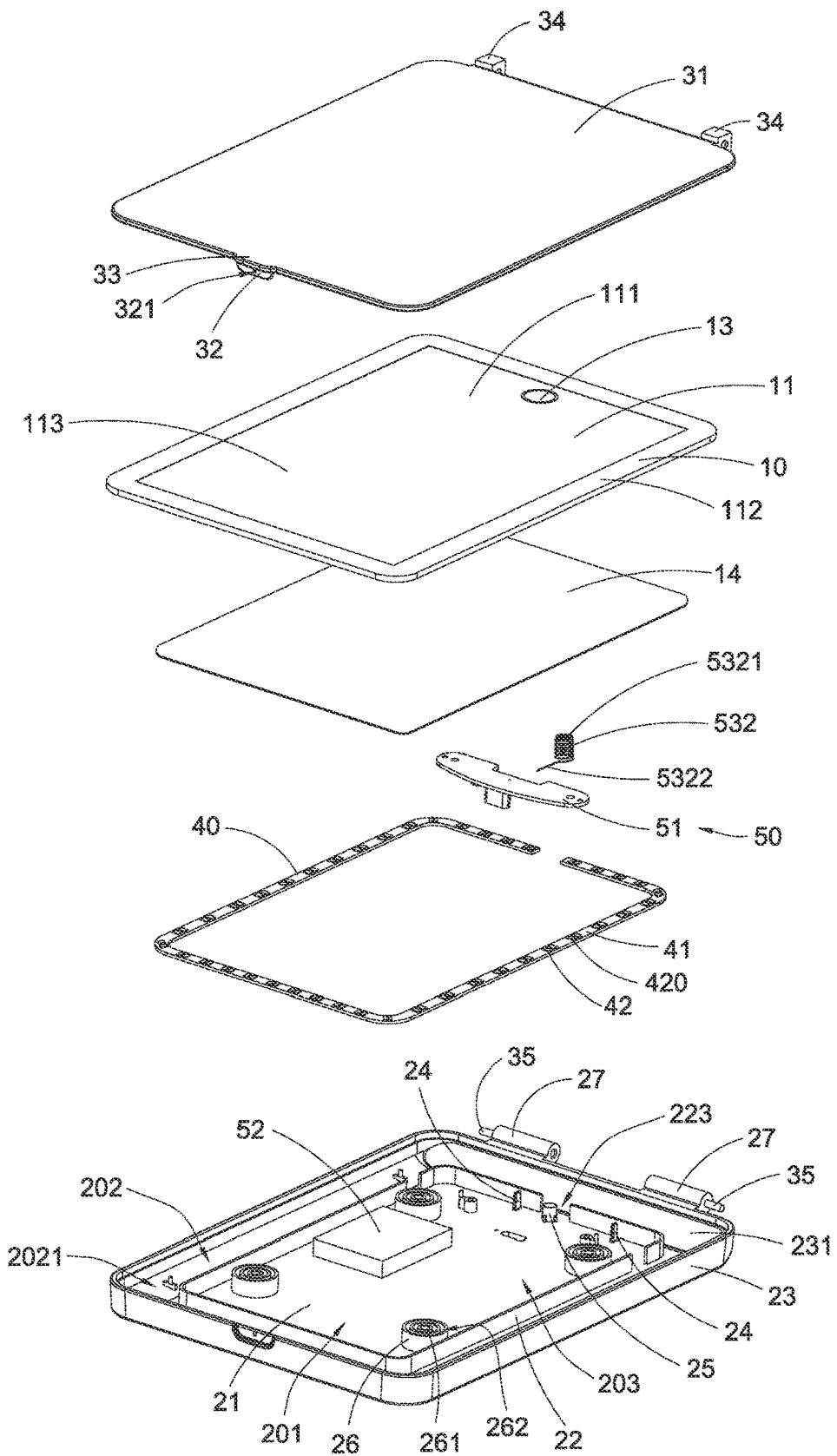
FIG. 5 is another exploded view of the portable light up mirror according to the above preferred embodiment of the present invention.

The light source 40 is provided adjacent to the edge portion 112 of the substrate layer 11, so that the light beams emitting from the light source 40 are able to pass through the edge portion 112 for illuminating the face of the user. As shown in FIGS. 4 and 5 of the drawings, the light source 40 comprises an elongated flexible circuit board 41 and a plurality of light emitting elements 42 electrically connected to the flexible circuit board 41, each of the light emitting elements 42 can be any type of light emitting component, such as LED. In this example, the plurality of light emitting elements 42 are arranged in the case element 20 facing towards the edge portion 112 of the substrate layer 11, so that light beams of the light emitting elements 42 are projected directly towards the edge portion 112 of the substrate layer 11 and pass through the edge portion 112 of the substrate layer 11 to reach the face of the user.

More specifically, the case element 20 comprises a base board 21, a mounting frame 22 connected to the base board 21 for supporting the mirror element 10 and a surrounding wall 23 extended from an edge of the base board 21 to define the inner cavity 201. An accommodating groove 202 extending in a ring shape is formed around the mounting frame 22 between the surrounding wall 23 and the base board 21. In this example, the light source 40 is disposed in the accommodating groove 202 in a manner that the plurality of light emitting elements 42 is evenly distributed along the entire length of the accommodating groove 202. In addition, an installing chamber 203 is defined between the mirror element 10, the mounting frame 22 and the base board 21 for installing the control unit 50.

As shown in FIG. 5 of the drawings, the light source 40 comprises a plurality of groups of light emitting elements 420 each comprising two light emitting elements 42, the groups of light emitting elements 420 are arranged in the accommodating groove 202 and two adjacent groups of light emitting elements 420 are spaced apart from each other. Preferably, the accommodating groove 202 is formed in a rectangular shape having four corners 2021, a group of light emitting elements 420 comprising two light emitting elements 42 is provided at each corner 2021, so as to enhance the illumination effect corresponding to the position of each corner 2021.

In the example shown in FIGS. 4 and 5 of the drawings, the edge portion 112 of the substrate layer 11 of the mirror element 10 comprises a blasted surface 1121 at an inner side facing the accommodating groove 202. Accordingly, the blasted surface 1121 typically becomes frosted or textured, so as to diffuse light that passes through it rather than allowing the light to transmit directly. In other words, the blasted surface 1121 diffuses the light emitted by the light source 40. Instead of having a focused beam of light, the light scatters in various directions due to the irregularities on the blasted surface 1121, so that the mirror element 10 and the light source 40 can create a softer, more ambient lighting effect compared to a clear transparent glass surface, and thus blasting the substrate layer 11 to form the blasted surface 1121 reduces glare by scattering the light, this can be particularly beneficial in avoiding direct glare from the light source 40 when the portable light up mirror is used to illuminate the face of the user. The diffused light can also help minimize harsh shadows, so as to create a more even distribution of light along the edge portion 112 of the substrate layer 11, so that the portable light up mirror is capable of providing even and glare-free illumination, and adequate lighting minimizes shadows on a user's face and give the user a more accurate view when grooming or applying cosmetics.

In addition, the frosted or textured appearance of the blasted surface 112 can add visual interest and aesthetic appeal to the mirror element 10, and also can obscure the view through the substrate layer 11 while still allow light to pass through. In other words, the light emitting elements 42 and flexible circuit board 41 in the accommodating groove 202 is not visible from the outside of the mirror element 10, but when the light source 40 is turned on, the light from the light emitting element 42 can pass through the edge portion 112 of the substrate layer 11 to reach the face of the user, and the illumination is even because of the light scattering effect of the blasted surface 112.

There are several methods to etch the edge portion 112 of the substrate layer 11 to form the blasted surface, such as sandblasting, chemical etching and engraving. As an example, the substrate layer 11 is a glass layer and in a sandblasting process, abrasive materials such as sand, aluminum oxide, silicon carbide, and garnet is used to blast the surface of the peripheral edge of the glass substrate in a sandblasting equipment, so as to form the blasted surface 1121 of the edge portion 112 of the substrate layer 11.

Accordingly, sandblasting is a technique can be adopted by the present invention to create a frosted or matte finish on glass surface of the edge portion 112 of the substrate layer 11. The process involves spraying a high-pressure stream of abrasive material onto the glass surface of the edge portion 112 of the substrate layer 11. This abrasive material erodes the surface, resulting in a textured or frosted appearance.

More specifically, the glass surface of the edge portion 112 of the substrate layer 11 to be sandblasted, which is at an inner side thereof facing toward the accommodating groove 202, is thoroughly cleaned and dried to remove any dirt, dust, or grease. The main body 111 of the glass substrate layer 11 that are not meant to be sandblasted are covered with a stencil or masking tape to protect them from the abrasive spray. Then, the glass substrate 11 is placed in a sandblasting cabinet or chamber, which contains the sandblasting equipment. The abrasive material is loaded into a blasting gun or nozzle connected to an air compressor, and then the blasting gun can be directed towards the glass surface of the edge portion 112 of the substrate layer 11 and the air compressor is activated to propel the abrasive material onto the glass surface of the edge portion 112 of the substrate layer 11 at high speed. The velocity of the abrasive particles hitting the glass surface causes abrasion, gradually eroding the surface to create the desired frosted effect. Once the desired frosted effect is achieved, the substrate layer 11 is removed from the sandblasting chamber and cleaned to remove any residual abrasive material. The stencil or masking tape used to protect the area of the main body 111 is also removed, revealing the frosted pattern or design on the glass surface of the edge portion 112 of the substrate layer 11.

In a chemical etching process for forming the blasted surface 1121, a glass etching cream or solution is applied to the exposed peripheral edge of the glass substrate, and then leave it on for the specified amount of time, then rinse it off thoroughly with water. In an engraving process for forming the blasted surface 1121, a rotary tool equipped with a diamond or carbide engraving bit can be used to etch the exposed peripheral edge of the glass substrate.

Figure 7:
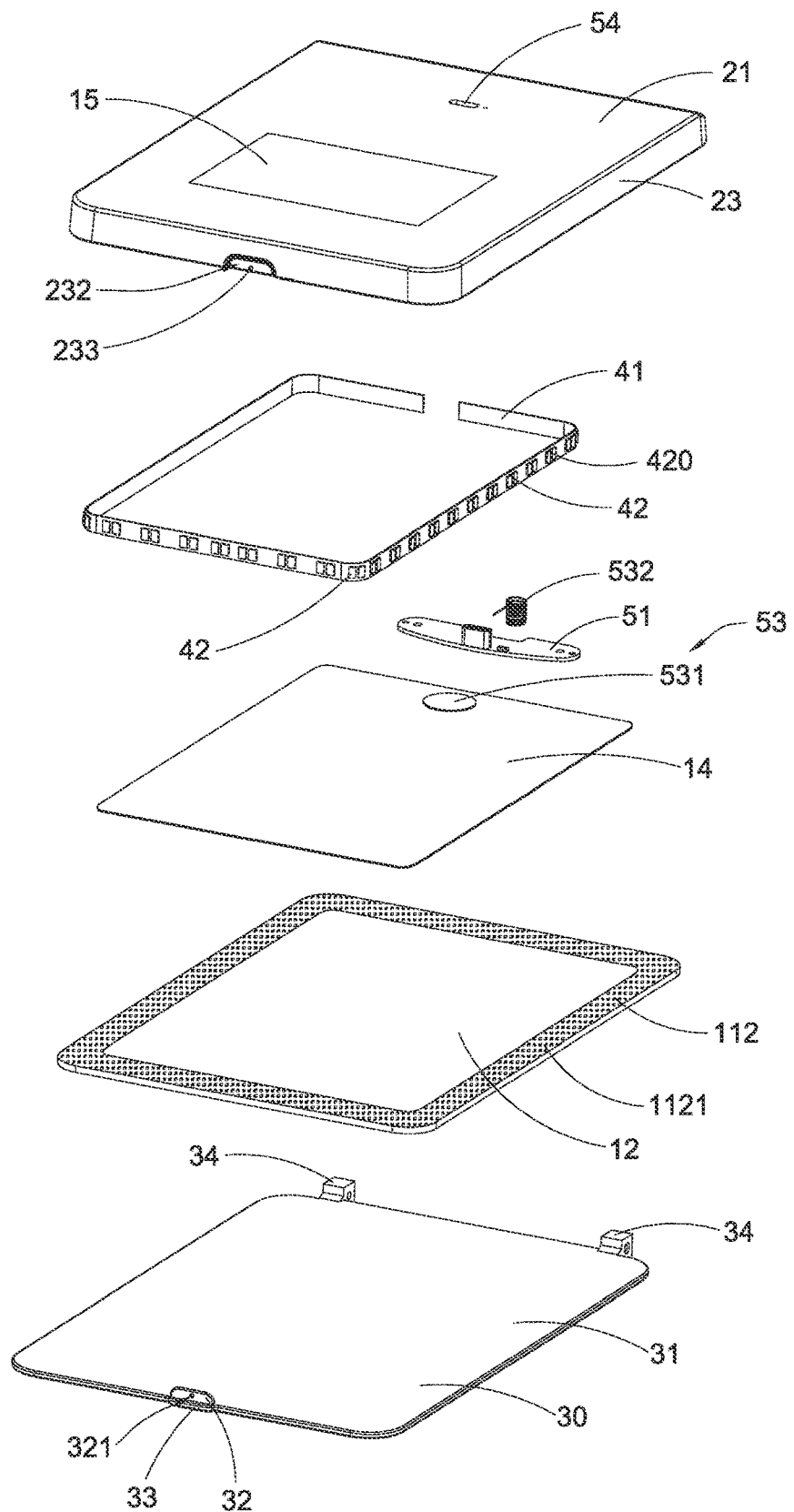
FIG. 7 is an exploded view illustrating a second modified example of the portable light up mirror according to the above preferred embodiment of the present invention.
Figure 8:
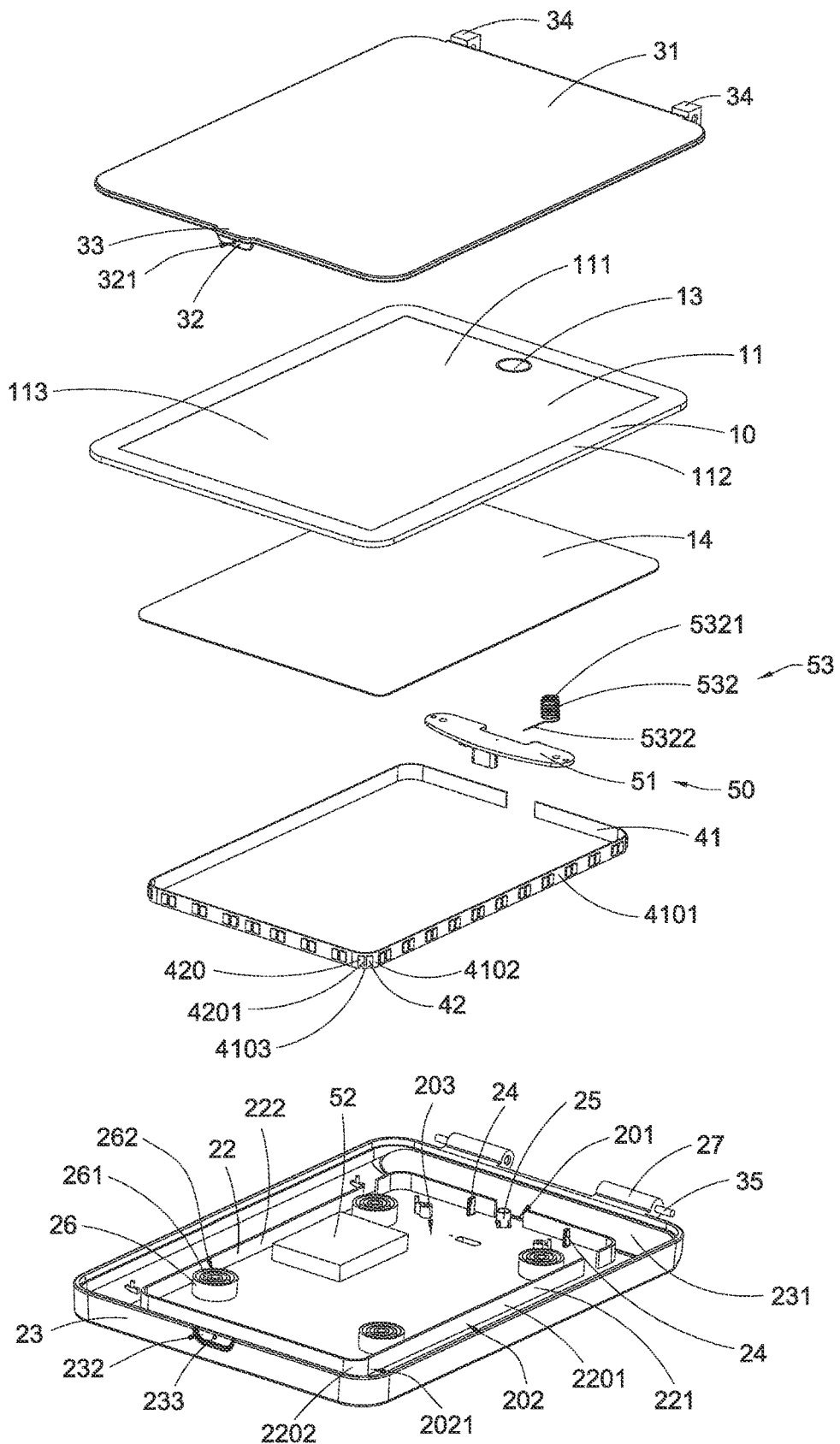
FIG. 8 is another exploded view illustrating the second modified example of the portable light up mirror according to the above preferred embodiment of the present invention.
Figure 9:
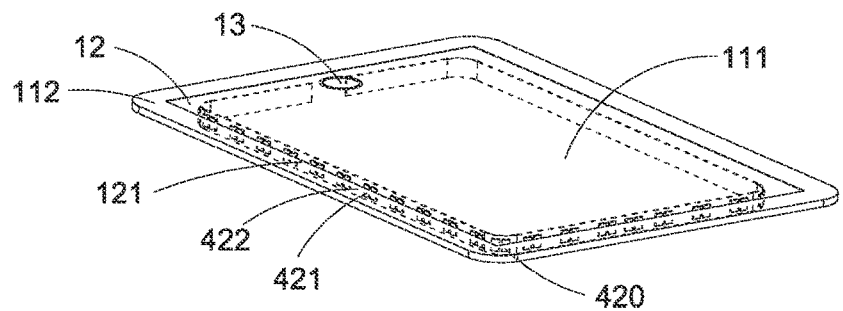
FIG. 9 is a perspective view illustrating the relationship between a reflective layer of a mirror element and a light source of the portable light up mirror according to the above preferred embodiment of the present invention.

As shown in FIGS. 7 to 9 of the drawings, in another example, the mounting frame 22 comprises an outer peripheral surface 221 facing the surrounding wall 23 of the case element 20, and the accommodating groove 202 is formed between the outer peripheral surface 221 of the mounting frame 22 and an inner surface 231 of the surrounding wall 23 of the case element 20. The light source 40 is attached to the outer peripheral surface 221 of the mounting frame 22 and is configured to be facing toward the inner surface 231 of the surrounding wall 23 of the case element 20. Accordingly, the flexible circuit board 41 is attached to the outer peripheral surface 221 of the mounting frame 22 and the plurality of light emitting elements 42 attached to the flexible circuit board 41 is facing towards the inner surface 231 of the surrounding wall 23 of the case element 20.

More specifically, each light emitting element 42 comprises a light emitting surface 421 and a side edge 422 oriented toward the mirror element 10, the light emitting surface 421 is oriented toward the surrounding wall 23 of the case element 20, not the mirror element 10, so that when the light source 40 is turned on, light beams from each light emitting element 42 will directly project onto the surrounding wall 23 of the case element 20 and are then reflected by the surrounding wall 23 of the case element 20 towards the edge portion 112 of the substrate layer 11, rather than directly projecting towards the edge portion 112 of the substrate layer 11.

Sine light beams of the light emitting elements 42 will not directly pass through the edge portion 112 of the substrate layer 11, the glare produced by the illumination of the light source 40 will further be avoided. In other words, directing light towards the surrounding wall 23 of the case element 20 before reflection can help in reducing glare or harsh reflections that could occur if light beams are directly projected towards the substrate layer 11. In addition, by directing light beams towards the surrounding wall 23 of the case element 20 before reflecting the light beams towards the edge portion 112 of the substrate layer 11, the design ensures a more uniform distribution of light across the substrate layer 11. This is also beneficial to prevent hot spots or uneven illumination. The indirect projection and reflection of light beams can also enhance the aesthetic appeal of the lighting setup, and create a softer, more diffused illumination effect.

In addition, with reference to FIG. 9 of the drawings, a peripheral edge 121 of the reflective layer 12 is extended to a position above the accommodating groove 202 in a manner that each light emitting element 42 is covered by the peripheral edge 121 of the reflective layer 12. In other words, the side edge 422 of each light emitting element 42 is not arranged behind the transparent edge portion 112 of the substrate layer 11, but is behind the peripheral edge 121 of the reflective layer 12, so that the light emitting elements 42 are hidden and concealed behind the peripheral edge 121 of the reflective layer 12, so that the light emitting elements 42 are not visible from external view, and thus the aesthetic appearance is enhanced. In addition, the peripheral edge 121 of the reflective layer 12 also functions to reflect the light beams of the light emitting elements 42, so as to further enhance the light scattering effect and prevent the light beams from the light emitting elements 42 to directly project onto the edge portion 112 of the substrate layer 11 to generate glare illumination.

As shown in FIGS. 7 and 8, the mounting frame 22 is a rectangular frame has a hole 223 formed at one of four frame portions 2201 and is communicating the installing chamber 203 with the accommodating groove 202. The flexible circuit board 41 comprises two end portions 411 which are respectively inserted into the installing chamber 203 by passing through the hole 223, and the two end portion 411 are then retained at an inner peripheral surface 222 adjacent to the hole 223.

The case element 20 comprises two retention pins 24 at two sides of the hole 223, so that the end portions 411 or connecting wires of the end portions 411 are retained between the retention pins 24 and the mounting frame 22, so as to retain the flexible circuit board 41 in position.

In this example, the rectangular mounting frame 22 comprises four bending corners 2202 each is formed between two adjacent frame portions 2201. The flexible circuit board 41 comprises four side sections 4101 and four transition corners 4102 each is formed between two adjacent side sections 4101. As shown in FIG. 8 of the drawings, a group of the light emitting elements 420 comprising two light emitting elements 42 is attached to each transition corner 4102 of the flexible circuit board 41 corresponding to the bending corner 2202 of the rectangular mounting frame 22 within the corner 2021 of the accommodating groove 202. Preferably, a center position 4201 of the group of the light emitting elements 420 is aligned with a center position 4103 of the transition corner 4102 of the flexible circuit board 41, so as to enhance the illumination from the corners 2021 of the accommodating groove 202.

This arrangement of the pairs of light emitting elements 420 at the transition corners 4102 of the flexible circuit board 41 enhances illumination at the corners 2021 of the accommodating groove 202, preventing the formation of dark spots and ensuring uniform lighting coverage throughout the entire edge portion 112 of the substrate layer 11.

Referring to FIGS. 4 to 8 of the drawings, the control unit 50 comprises a circuit board 51 and a rechargeable battery 52 electrically connected to the circuit board 51, and one end portion 411 of the flexible circuit board 41 is electrically connected to the circuit board. The rechargeable battery 52 can be nickel-cadmium battery, nickel-hydrogen battery, lead-acid battery, lithium-ion battery, or lithium-polymer battery. The circuit board 51 and the rechargeable battery 52 is mounted to the base board 21 of the case element 20 and is disposed in the installing chamber 203 and thus is housed within the base board 21, the mounting frame 22 and the mirror element 10.

In this embodiment, the control unit 50 further comprises a capacitive sensing element 53 which is electrically connected to the circuit board 51 that is integrated with a capacitive touch controller chip 511, when a finger of the user approaches the surface of the mirror element 10, the finger disrupts the electromagnetic field around the capacitive sensing element 53 and cause a change in capacitance, and this change is detected by the capacitive touch controller chip 511, triggering a response such as activating the light source 40, turning off the light source or adjusting illumination intensity of the light source 40.

The capacitive sensing element 53 comprises an sensing layer 531 and a spring 532 biasing against the sensing layer 531, the spring 532 is an electrical conductor that is electrically connected to the circuit board 51. The sensing layer 531 is an electrical conductor such as a copper foil that is attached to the back side of the mirror element 10.

Accordingly, the structure of the capacitive touch switch of the present invention comprises a sensing copper foil beneath which a spring 532 is positioned. The spring 532 is electrically connected to the capacitive touch controller chip 511. The sensing copper foil is utilized to enhance sensitivity to touch. In addition, the presence of the spring 532 can impact the capacitive characteristics of the capacitive sensing element 53. More specifically, when the spring 532 is compressed, the capacitance change of the capacitive sensing element 53 is enhanced. Consequently, this can influence the responsiveness of the capacitive touch controller chip 511.

As shown in FIGS. 4 and 7 of the drawings, the copper sensing layer 531 can be formed as a round plate, and a diameter of the sensing layer 531 is larger than a diameter of the elastic spring 532.

The working principle of this structure lies in the capacitance change that occurs due to the finger placed above the sensing layer 531 which is a copper foil, this change is then detected by the capacitive touch controller chip 511, which interprets it as a touch input.

The technical advantage of this structure lies in its ability to provide sensitive and responsive touch detection. By incorporating the spring 532 beneath the copper sensing layer 531, the structure allows for precise detection of the finger touch through capacitance change. This enables fine-tuning of the sensitivity and responsiveness of the capacitive touch control switch of the present invention, ensuring accurate detection of touch inputs while maintaining consistent performance over time. Additionally, the use of the spring 532 also adds mechanical resilience to the structure, enhancing its durability and longevity.

It is worth mentioning that the copper sensing layer 531 is positioned beneath the substrate layer 11 which may be a glass layer. Even when the user's finger touches the substrate layer 11 of the mirror element 10 above the sensing layer 531, the capacitive touch switch remains effective. This is because the capacitive touch controller chip 511 is capable of detecting changes in capacitance.

As shown in FIG. 5 and FIG. 8 of the drawings, the spring 532 comprises a connecting end portion 5321 which is electrically connected to the circuit board 51, and a biasing end portion 5322 which is biasing against the sensing layer 531. The case element 20 comprises a mounting pin 25 which is extended from the case board 21, and the spring 532 is wound around the mounting pin 25, so that the mounting pin 25 retains the spring 532 in position.

It is thus can be seen that the user can effortlessly control the lighting source 40 with a simple touch of his or her finger, so as to enhance user convenience. This intuitive touch-control feature streamlines the design by eliminating the need for an additional mechanical button. In other words, no mechanical button is required to be mounted in the case element 20 and connected to the circuit board 51 so that the mirror element 10 is easy to be stacked above on the case board 21. By arranging the touch switch in a manner that allows for touch input through the substrate layer 11, this ensures space efficiency in installing the mirror element 10 and avoids the constraint of having mechanical buttons penetrate through the mirror element 10 which could compromise the overall integrity of the mirror element 10 and increase the usable surface area.

As shown in FIG. 1, FIG. 4 and FIG. 7, the control unit 50 comprises an electrical charging interface 54 such as a USB interface which is electrically connected to the rechargeable battery 52 for being electrically connected to a charging power source to electrically charge the rechargeable battery 52. The electrical charging interface 54 is mounted to the case board 21 at a side opposite to the mirror element 10.

As shown in FIGS. 4 to 8, an indication pattern 13 which is distinguishable from the transparent material of the substrate layer 11, achieved through laser etching, is strategically placed on the surface of the mirror element 10 and is aligned with the capacitive sensing element 53 to signify a finger touch area of the mirror element 10 at a front side of the mirror element 10 corresponding to the area of the capacitive sensing element 53 behind the mirror element 10, so that the finger touch area is integrated within the mirror element 10 itself, This approach also eliminates the need for additional space to accommodate or install a separate control switch on the casing element 20 for controlling the lighting source 40, so that the entirety of the mirror element 10 can be dedicated solely to reflection, maximizing its functionality and usability.

When the substrate layer 11 is a glass layer, the laser etching, a precise and versatile technique, is employed to create the indication pattern 13 on the glass surface. The process involves the use of a high-powered laser beam focused onto the glass, which generates controlled heat energy. This localized heat energy alters the molecular structure of the glass, resulting in a desired pattern or design of the indication pattern 13.

More specifically, the laser etching process begins with the preparation of a digital design file, specifying the desired pattern or image. This digital file is then uploaded to a computer-controlled laser etching machine. The machine precisely positions the laser beam according to the design specifications onto the glass surface of the substrate layer 11. As the laser beam interacts with the glass, it vaporizes or ablates the material, leaving behind the desired pattern. The intensity and duration of the laser beam exposure can be adjusted to achieve varying depths and levels of detail in the etched pattern. Additionally, since it is a contactless process, there is minimal risk of damage to the glass surface of the substrate layer 11.

It is also worth mentioning that the indication pattern 13 is formed on a bottom back of the substrate layer 11, so that the front side of the substrate layer 11 is an integral smooth surface.

Alternatively, in other embodiments, the portable light up mirror may be installed with other switch mechanism such as optical sensor switch or mechanical button that when the cover element 30 is moved away from the case element 20 to expose the mirror element 10, the light source 40 is automatically turned on by the switch mechanism, and when the cover element 30 is covered on the mirror element 10, the light source 40 is automatically turned off, so as to reduce energy consumption and facilitate the use of the portable light up mirror.

Referring to FIGS. 4 and 7 of the drawings, the mirror element 10 further comprises a reinforcing layer 14 attached to the reflective layer 12 by a glue. The reinforcing layer 14 is a specialized safety film applied to the back side of the substrate layer 11 to mitigate the hazards associated with explosions, impacts, or other high-velocity events. This reinforcing layer 14 is a film which is typically made of multiple layers of durable materials, such as polyester or polyethylene terephthalate (PET), which are laminated together with strong adhesives. As shown in FIG. 7, the plurality of light emitting element 42 is hidden behind the reinforcing layer 14, so that the light source 40 is not visible from the outer side of the mirror element 40.

Accordingly, the sturdy reinforcement layer 14 is incorporated into the mirror element 10 to bolster its durability and safeguarding. This added layer acts as a barrier against potential crack, damage or breakage when the portable light up mirror accidentally fall. By reinforcing the mirror, its lifespan and resilience are significantly extended, guaranteeing sustained performance and safety for the user.

Figure 6:
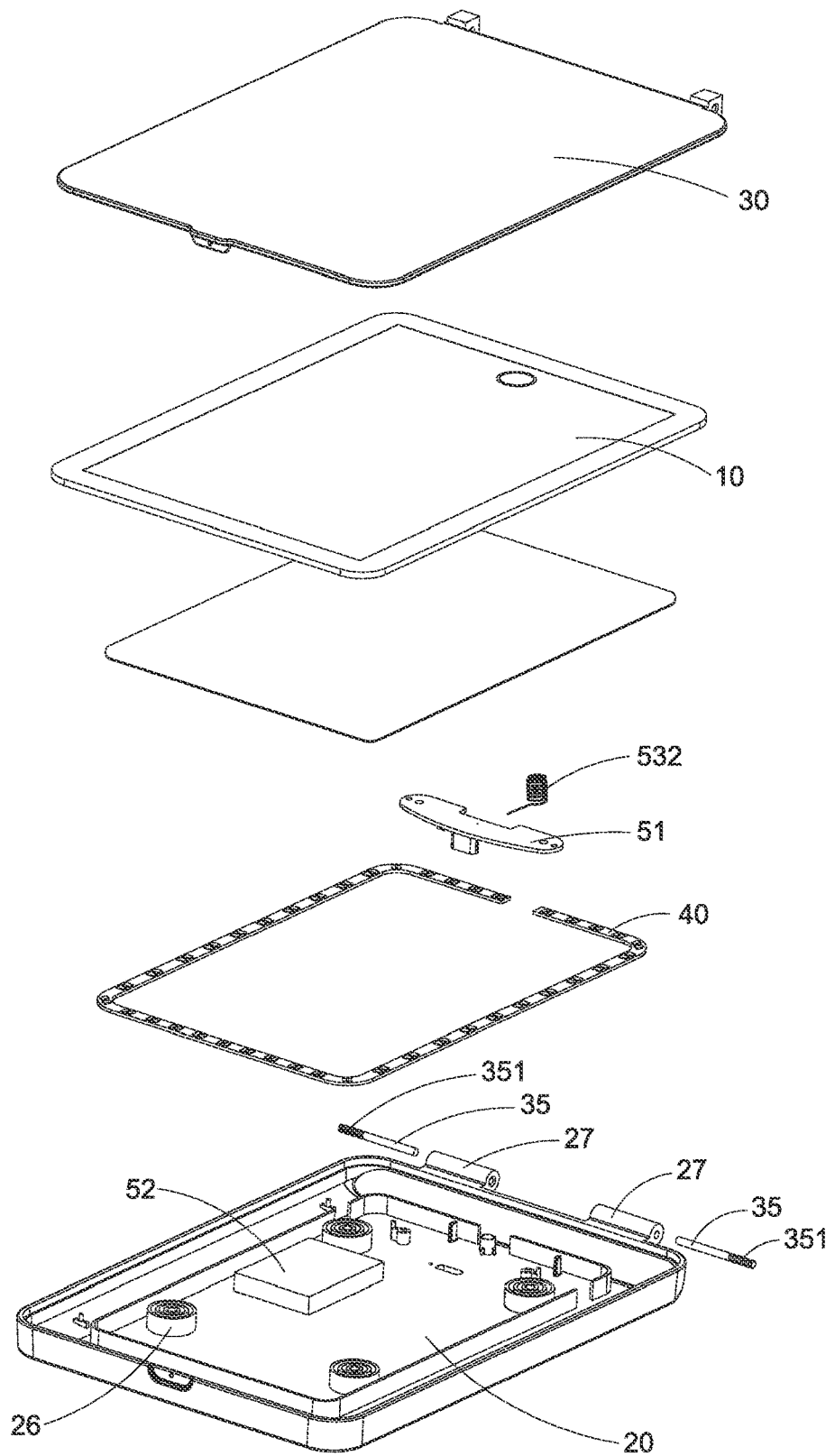
FIG. 6 is an exploded view illustrating a first modified example of the portable light up mirror according to the above preferred embodiment of the present invention.

As shown in FIGS. 5, 6 and 8 of the drawings, the case element 20 further comprises a plurality of supporters 26, such as four supporters 26, extended from the base board 21 for supporting the mirror element 10. Each supporter 26 comprises a plurality of coaxial circular supporting walls 261 defining one or more glue grooves 262 formed between two adjacent supporting walls 261, so that glue can be applied into the glue grooves 262 for adhering and bonding the mirror element 10 to the supporters 26, so as to firmly secure the mirror element 10 in the case element 20.

Figure 3:
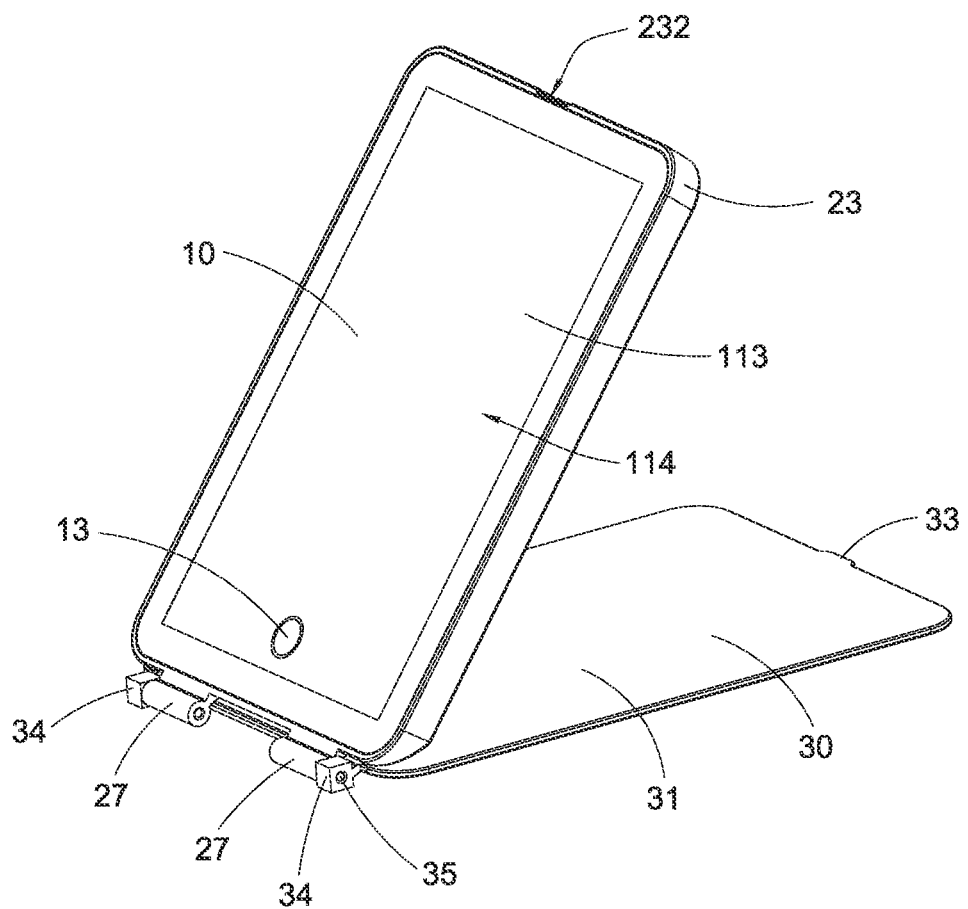
FIG. 3 is perspective view illustrating the portable light up mirror being in a usage state according to the above preferred embodiment of the present invention.

Referring to FIG. 3, when the mirror element 10 is assembled in the inner cavity 201 of the case element 20, a front surface 113 of the substrate layer 11 is a top surface of the mirror element 10. The front surface 113 is arranged at a height position that is lower than a height position of a top edge of the surrounding wall 23, so that actually an indented groove 114 is formed between the surrounding wall 23 of the case element and the front surface 113 of the substrate layer 11, so that the front surface 113 of the substrate layer 11 is protected in the case element 20, and when the cover element 30 is stacked on the case element 20, the impact on the cover element 30 is prevented from exerting on the front surface 113 of the substrate layer 11 to result in breakage of the substrate layer 11 of the mirror element 10. In other words, by preventing direct impact on the front surface 113 of the substrate layer 11, the risk breakage of the substrate layer 11 of the mirror element 10 is mitigated.

The cover element 30 comprises a cover board 31 and a hook end 32 which is vertically extended from the cover body 31 for detachably engaging with the case element 20. More specifically, the hook end 32 has a hook hole 321, the surrounding wall 23 of the case element 20 has an engaging groove 232 for receiving the hook end 32 and comprises an engaging pin 233 which is used to be engaged with the hook hole 321 of the hook end 32, so that when the cover element 30 is overlapping aligned with the mirror element 10, the engagement between the engaging pin 233 and the hook hole 321 of the hook end 32 will secure the cover element 30 with the case element 20. Alternatively, the hook hole 321 is formed in the surrounding wall 23 while the engaging pin 233 is protruded on the hook end 32.

The cover element 30 further comprises an operation end 33 which is extended and protruded from the cover board 31 and may be preferred formed at a position adjacent to the hook end 32, so as to facilitate the user to pull the operation end 33 to detach the hook end 32 from the case element 20, so as to expose the mirror element 10 and allow for easy access to the mirror element 10 when preparing to use the mirror element 10.

According to this embodiment, the cover element 30 is pivotally mounted to the case element 20 so that the portable light up mirror is able to be shifted between a usage state in which the case element 20 is supported by the cover element 30 to expose the mirror element 10 for a user and an idle state in which the cover element 30 is moved to a position covering the mirror element 10 between the cover element 30 and the case element 20.

More specifically, the cover element 30 further comprises at least one pivot arm 34, the case element 20 further comprises at least one pivot base 27, and a pivot pin 35 is penetrating the pivot arm 34 and the pivot base 27, so as to pivotally couple the pivot arm 34 with the pivot base 27, so that the cover element 30 can be pivotally rotated to move respect to the case element 20.

Figure 10:
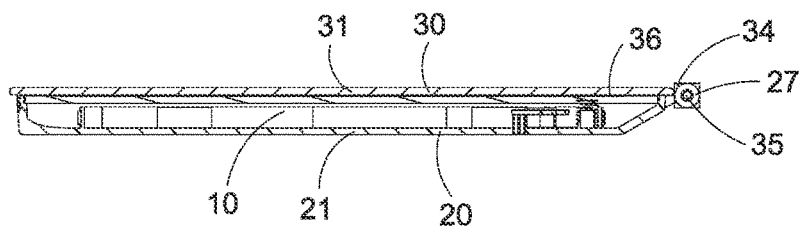
FIG. 10 is a sectional view of the portable light up mirror being in an idle state according to the above preferred embodiment of the present invention.

As shown in FIG. 10 of the drawings, when the cover element 30 is covered on top of the case element 20, a center position of the pivot pin 35 is not lower than an engaging plane 36 which is formed by a bottom surface of the cover element 30 which is abutting against a top edge of the surrounding wall 23 of the case element 20, this configuration allows the convenient pivotal movement of the cover element 30. In an example, the center position of the pivot pin 35 is in the same plane with the engaging plane 36 between the cover element 30 and the case element 20, as shown in FIG. 10. In another example, the center position of the pivot pin 35 is above the engaging plane 36 between the cover element 30 and the case element 20.

Figure 11:
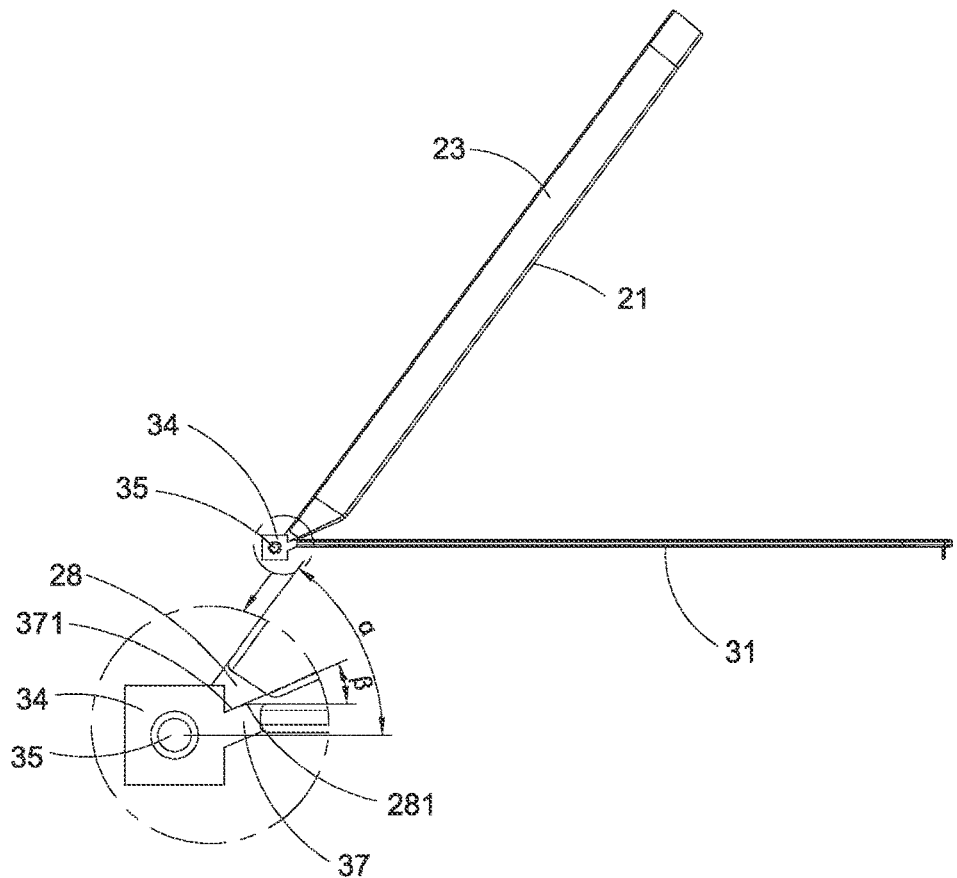
FIG. 11 is a sectional view of the portable light up mirror being in a usage state according to the above preferred embodiment of the present invention.
Figure 12:
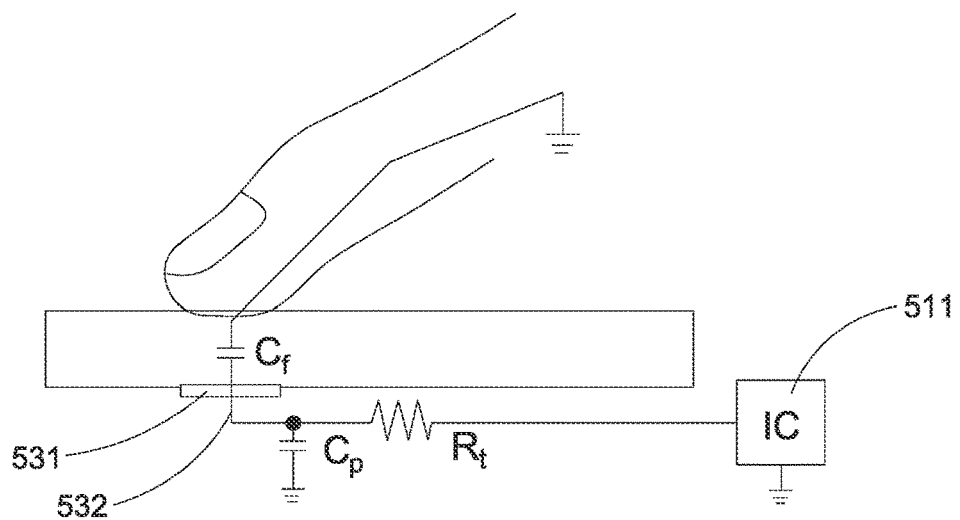
FIG. 12 is a schematic view illustrating the finger touch control principle of the portable light up mirror according to the above preferred embodiment of the present invention.

Referring to FIG. 11, when the cover element 30 is pivotally rotated to a horizontal state for supporting the case element 20, the case element 20 is preferred to be inclinedly supported above the cover element 30 in a manner that the back side of the case element 20 is oriented towards the cover element 30 while the mirror element 10 at the front side of the case element 20 is exposed for the user.

In the usage state, when the cover element 30 is in a horizontal state and the case element 20 is stopped on the cover element 30 and can not further pivotally move, an included angle $\alpha$ is defined between the cover element 30 and the case element 20 which can be designated as the angle between the horizontal cover board 31 and the mirror element 10. preferably, the included angle α is ranged from 30°-80°. As an example, the included angle α can be 45°.

The cover element 30 also can support the case element 20 which is vertically standing in the usage state. At that time, the angle between the horizontal cover board 31 and the mirror element 10 is 90°. In this embodiment, the cover element 30 comprises two pivot arms 34, the case element 20 comprises two pivot base 27, and each of the two pivot pins 35 is respectively penetrating the corresponding pivot arm 34 and the pivot base 27, so as to pivotally couple each pivot arm 34 with the corresponding pivot base 27. The material of each of the pivot pins 35 and the material of the pivot bases 27 are selected so that the frictional contacting between the pivot pin 35 and the corresponding pivot base 27 is enhanced, so that there is possibility that the mirror element 10 may be supported with an inclination angle between the included angle α and 90°, so as to optimize the visibility of the reflection of the mirror element 10 and ensure that the reflected image remains visible to the person in front of the mirror element 10 without causing distortion or discomfort. As an example, each of the pivot pins 35 is made of stainless steel while the corresponding pivot base 27 is made of Acrylonitrile Butadiene Styrene. Accordingly, both of the cover element 30 and the case element 20 can be made of suitable material such as Acrylonitrile Butadiene Styrene.

As another alternative mode, as shown in FIG. 6 of the drawings, each pivot pin 35 comprises a surface texture structure 351 which is embedded in the corresponding pivot base 27 to enhance the frictional contact between the pivot pin 35 and the corresponding pivot base 27. As an example, the surface texture structure 351 comprises a plurality of threads. Accordingly, in an illustrative occasion when the mirror element 10 is moved to a position having an inclination angle of 80° with respect to the horizontal plane, the friction between the pivot pins 35 and the corresponding pivot bases 27 may be able to retain the mirror element 10 in the inclination angle 80° and the mirror element 10 will not fall down to the position at the inclination angle corresponding to the included angle α. Accordingly, the mirror element 10 can be versatility supported at various positions, offering the user the flexibility to view his or her reflection from preferred angles. This adjustable functionality enriches user experience by catering to individual preferences and optimizing visibility during use.

In this embodiment, with reference to FIG. 11, the cover element 30 further comprises a limitation portion 37 inclinedly extended between the pivot arms 34 and the cover board 31, the case element 20 further comprises a connecting portion 28 inclinedly extended between the pivot bases 27 and the base board 21. The limitation portion 37 comprises an inclined limiting surface 371 and the connecting portion 27 comprises an inclined abutting surface 281, when the inclined abutting surface 281 is parallel with the inclined limiting surface 371 and is abutting against the inclined limiting surface 371, the further pivotal movement between the cover element 30 and the case element 20 is stopped, so that the mirror element 10 is supported at the position corresponding to the included angle α. According to this embodiment, as shown in FIG. 10, the inclination angle β of the inclined limiting surface 371 and the inclined limiting surface 371 can be about 25° when the case element 20 is stopped on the cover element 30 and can not pivotally move down. The plane containing the extending direction of the connecting portion 27 pass through the center of each pivot pin 35 while the plane containing the extending direction of the limitation portion 37 is deviated from the center of each pivot pin 35.

In addition, as shown in FIGS. 1, 4 and 7 of the drawings, the mirror element 10 may further comprise a magnification mirror 15 mounted at the back side of the base board 21, so that the substrate layer 11 of the mirror element 10 and the magnification mirror 15 are respectively provided at two opposite sides of the base board 21. The magnification mirror 15, such as 1×, 3×, 5×, or even higher magnification levels, is arranged to allow for detailed makeup application or precise grooming tasks.

Referring to FIGS. 13 and 14A to 14L of the drawings, an illustrative manufacturing method of the portable light up mirror according to this preferred embodiment is illustrated, the manufacturing method comprises a step of preparing the mirror element 10, a step of mounting the light source 40 on the case element 20, a step of installing the control unit 50, a step of mounting the mirror element 10 into the case element 20, and a step of mounting the cover element 30 to the case element 20.

Figure 13:
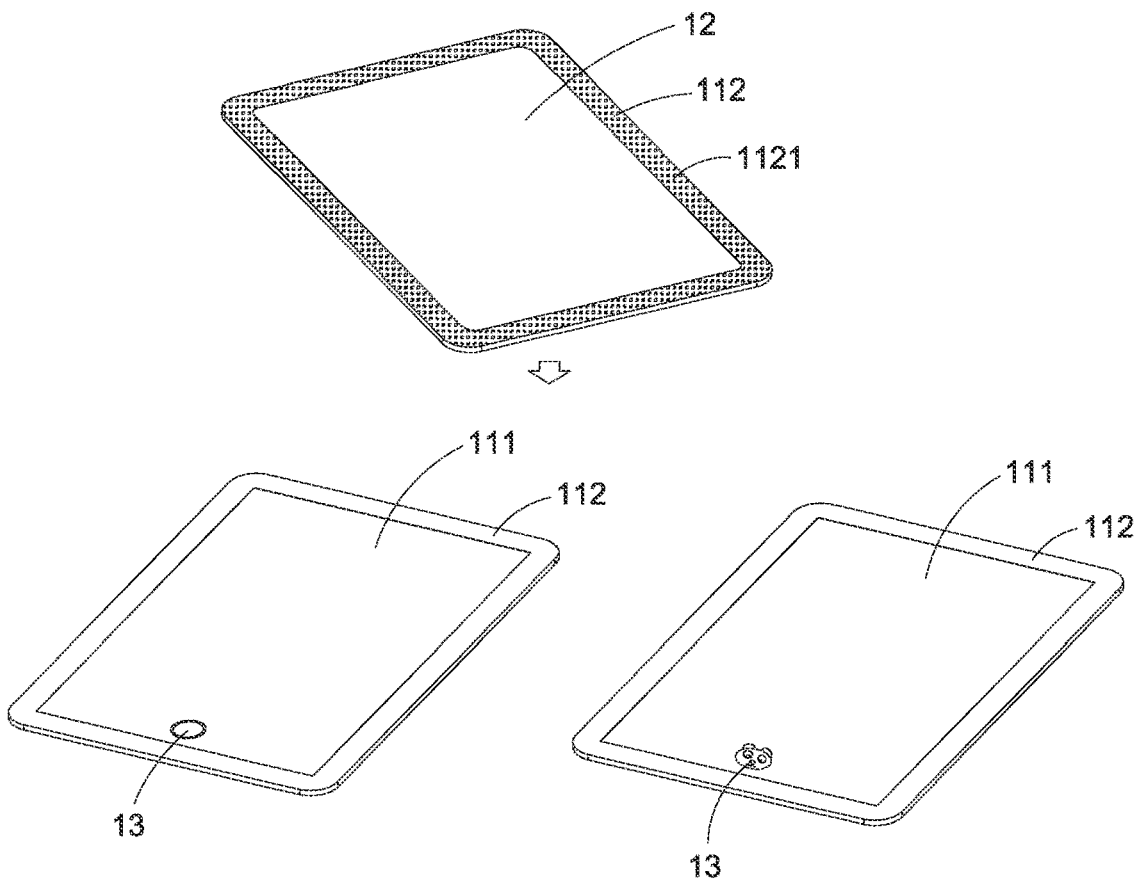
FIG. 13 is a schematic view illustrating the preparing of the mirror element of the the portable light up mirror according to the above preferred embodiment of the present invention.

In the step of preparing the mirror element 10, as shown in FIG. 13 of the drawings, the edge portion 112 of the substrate layer 11 is subject to a sandblasting process to form the blasted surface 1121, the indication pattern 13 is formed on the surface of the substrate layer 11 through a laser etching process, the substrate layer 11 is coated with the reflective layer 12, and a reinforcing layer 14 is attached to the reflective layer 12 at the back side of the substrate layer 11.

Figure 14A:
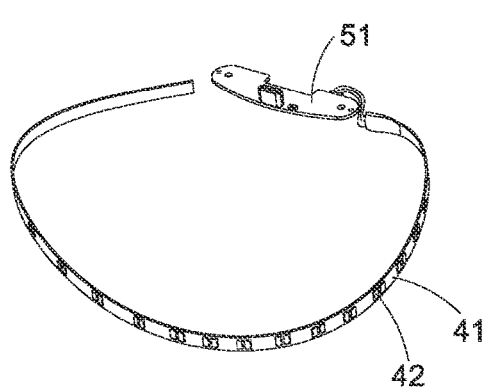
FIGS. 14A, 14B, 14C, 14D, 14E, 14F, 14G, 14H, 14I, 14J, 14K, 14L are schematic views illustrating the assembling process of the portable light up mirror according to the above preferred embodiment of the present invention.
Figure 14B:
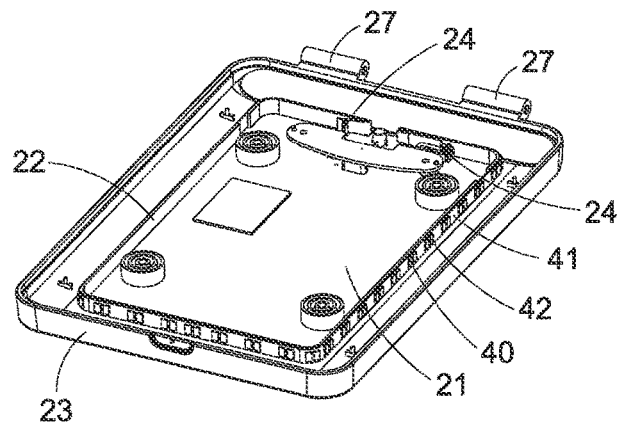
Figure 14D:
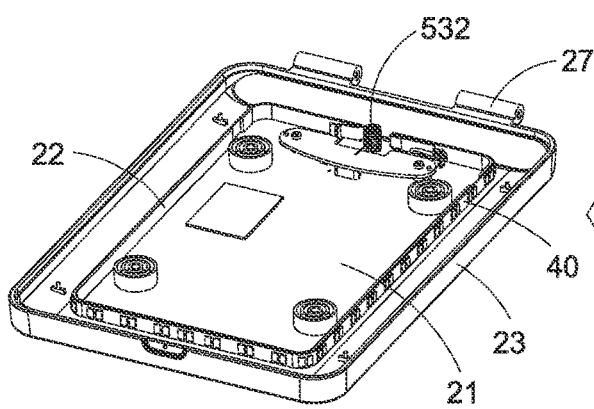
Figure 14C:
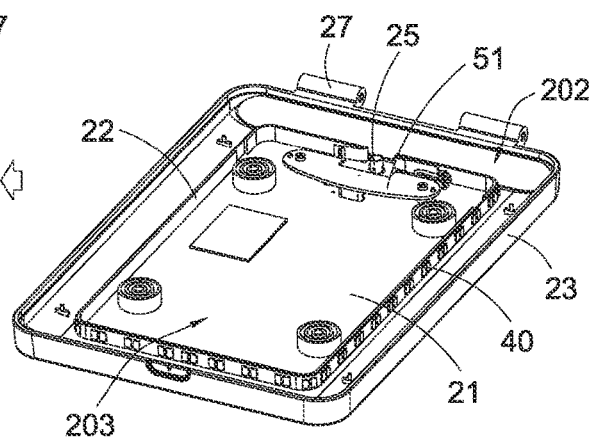

When mounting the light source 40 to the case element 20, as shown in FIGS. 14A to 14C, the flexible circuit board 41 of the light source 40 is attached to the outer peripheral surface 221 of the mounting frame 22 in a manner that the plurality of light emitting elements 42 are orientated towards the surrounding wall 23 of the case element 20, two end portions 411 of the flexible circuit board 41 are inserted into the installing chamber 203 through the hole 223 and retained between the retention pins 24 and the mounting frame 22, one end portion 411 of the flexible circuit board 41 is electrically connected to the circuit board 51 of the control unit 50.

Figure 14E:
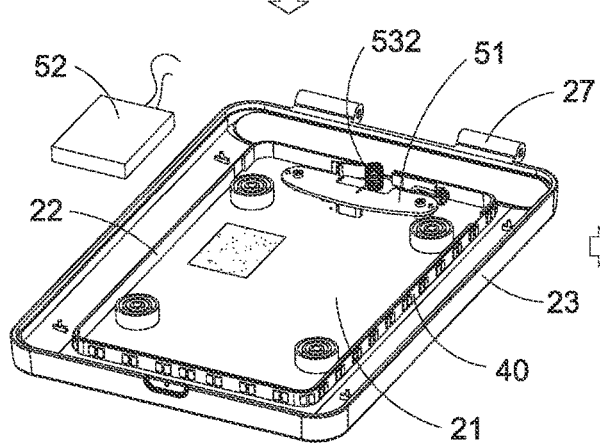
Figure 14F:
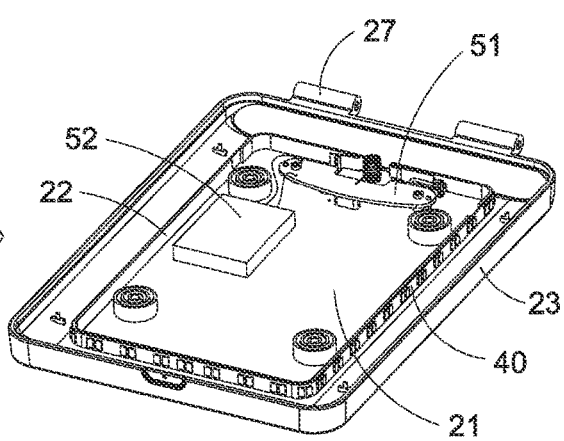

When installing the control unit 50, as shown in FIGS. 14D to 14F, the circuit board 51 is attached to the base board 21 of the case element, the spring 532 is mounted to the mounting pin 25 and is an electrical conductor that is electrically connected to the circuit board 51, the rechargeable battery 52 is installed to the base board 21 and is electrically connected to the circuit board 51.

Figure 14G:
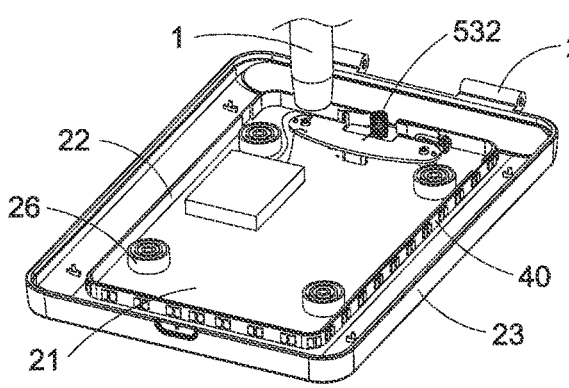
Figure 14H:
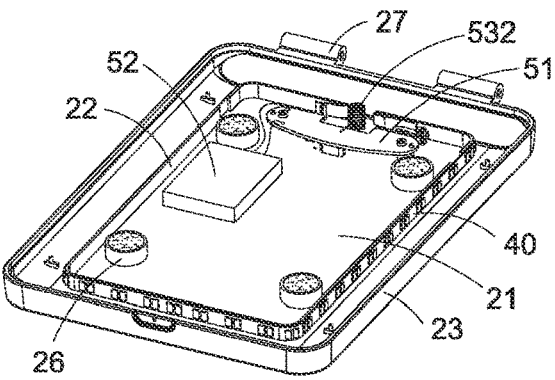
Figure 14J:
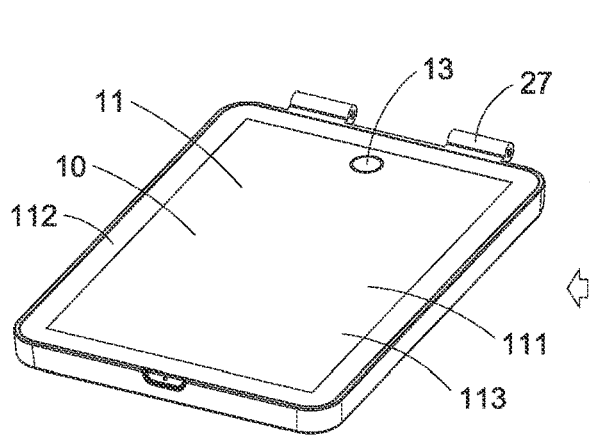
Figure 14I:
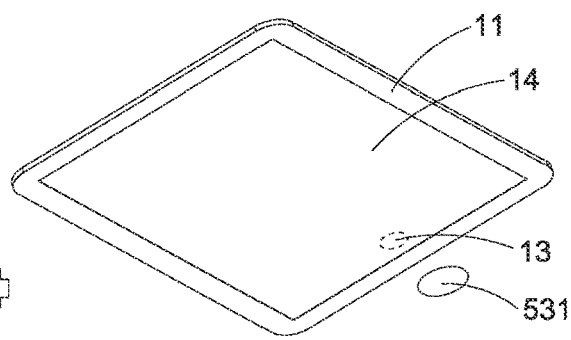

In the step of mounting the mirror element 10 into the case element 20, As shown in FIG. 14G, a dust removing tool 1 is firstly used to remove dust in the case element 20; as shown in FIG. 14H, the glue is applied on the supporters 26; as shown in FIG. 14I, the sensing layer 531 is attached to the mirror element 10 at a position corresponding to the indication pattern 13; and then, as shown in FIG. 14J, the mirror element 10 is adhered to the supporters 26 so as to fix the mirror element 10 to the case element 20.

Figure 14K:
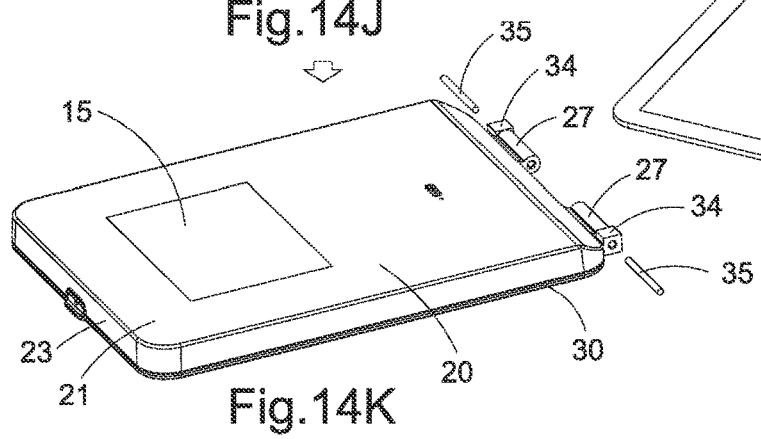
Figure 14L:
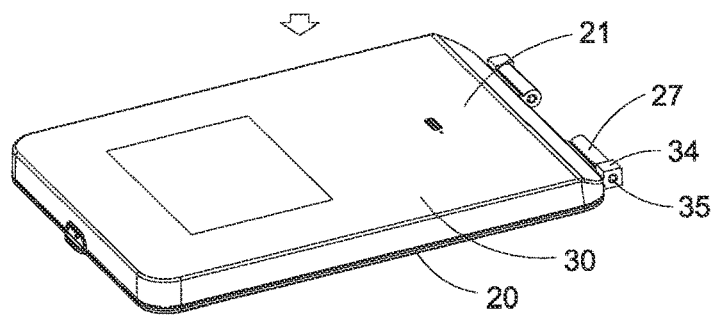

When mounting the cover element 30 to the case element 20, as shown in FIGS. 14K to 14L, the pivot arms 24 of the cover element 30 are aligned with the pivot bases 27, and then two pivot pins 35 are respectively punched into the pivot arms 24 and the pivot bases 27, so that the cover element 30 is pivotally mounted to the case element 20.

Figure 15:
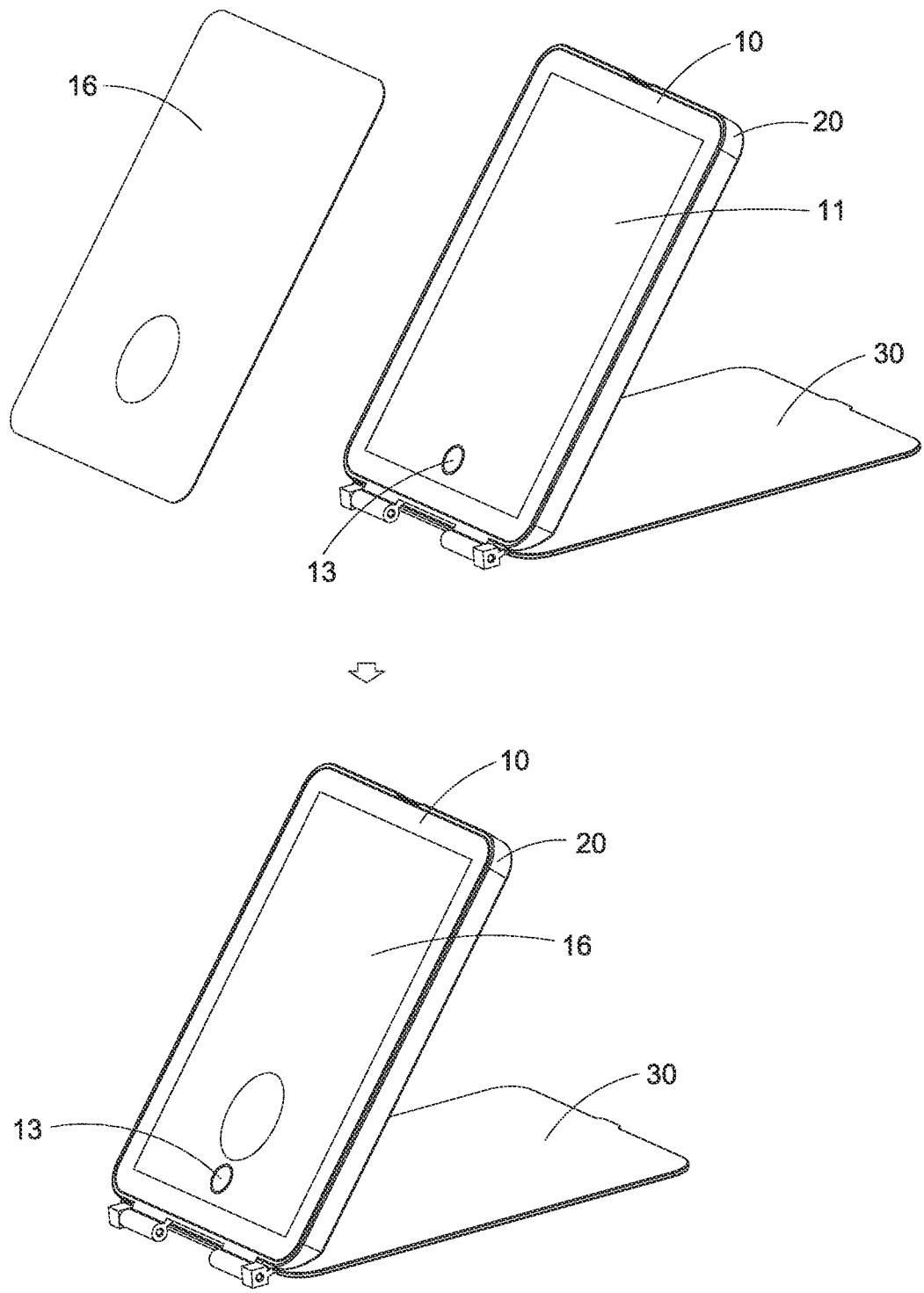
FIG. 15 is a schematic view illustrating the process of attaching a protection film for the mirror element of the portable light up mirror according to the above preferred embodiment of the present invention.
Figure 16:
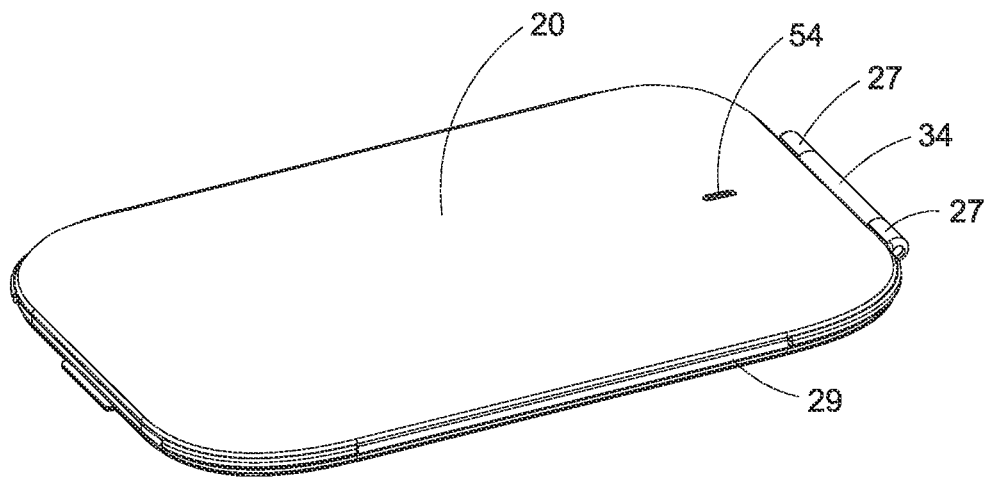
FIG. 16 is a perspective view of a portable light up mirror according to a first alternative mode of the above preferred embodiment of the present invention.
Figure 17:
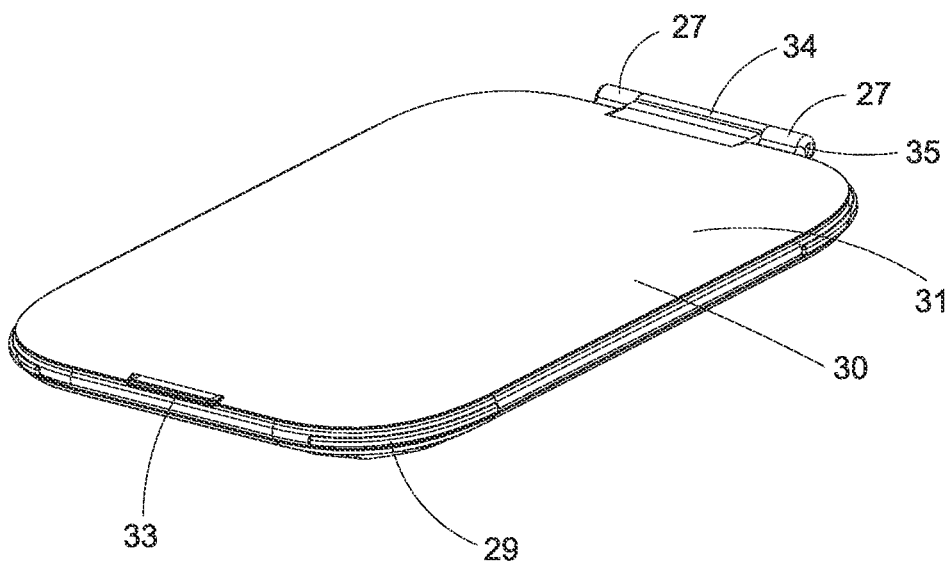
FIG. 17 is another perspective view of the portable light up mirror according to the first alternative mode of the above preferred embodiment of the present invention.
Figure 18:
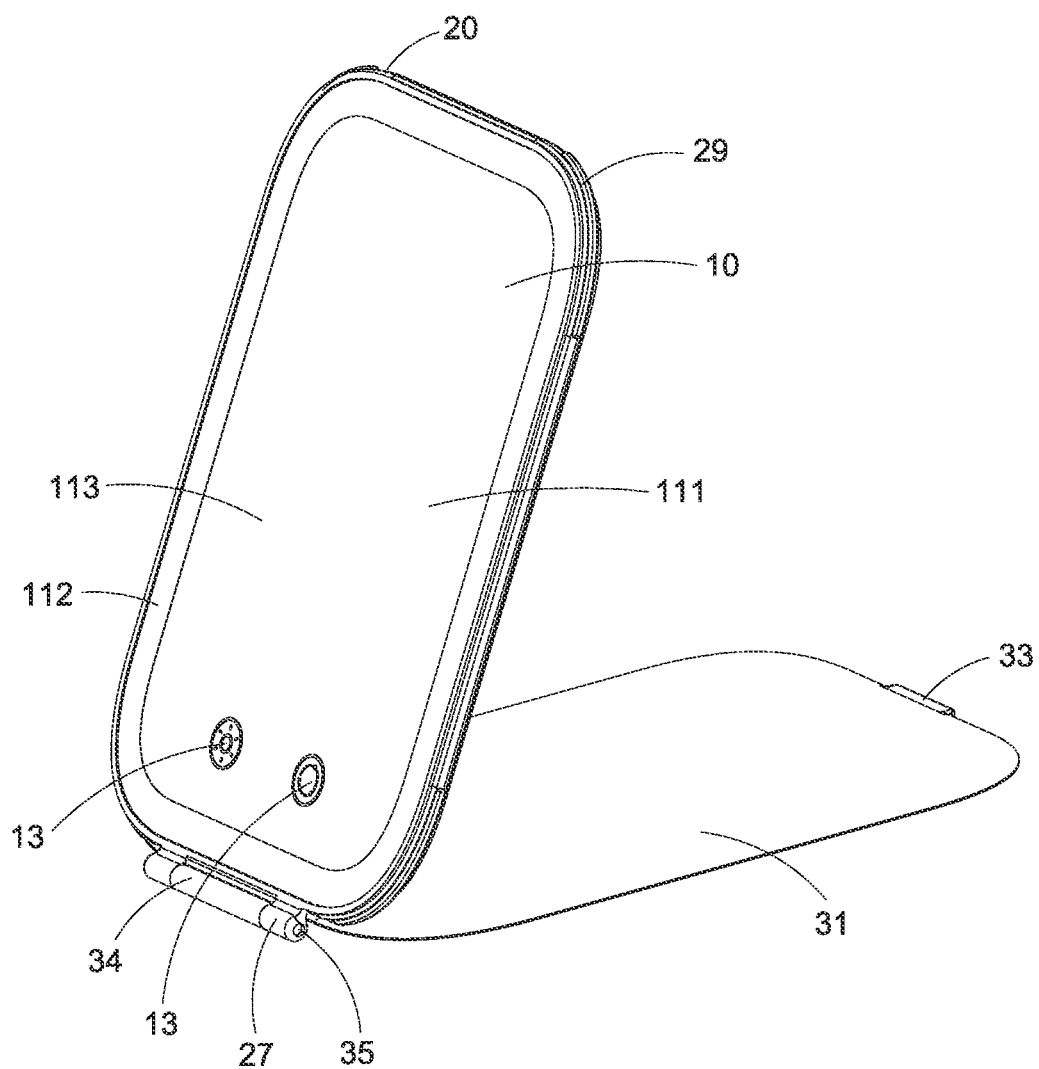
FIG. 18 is perspective view illustrating the portable light up mirror being in a usage state according to the first alternative mode of the above preferred embodiment of the present invention.
Figure 19:
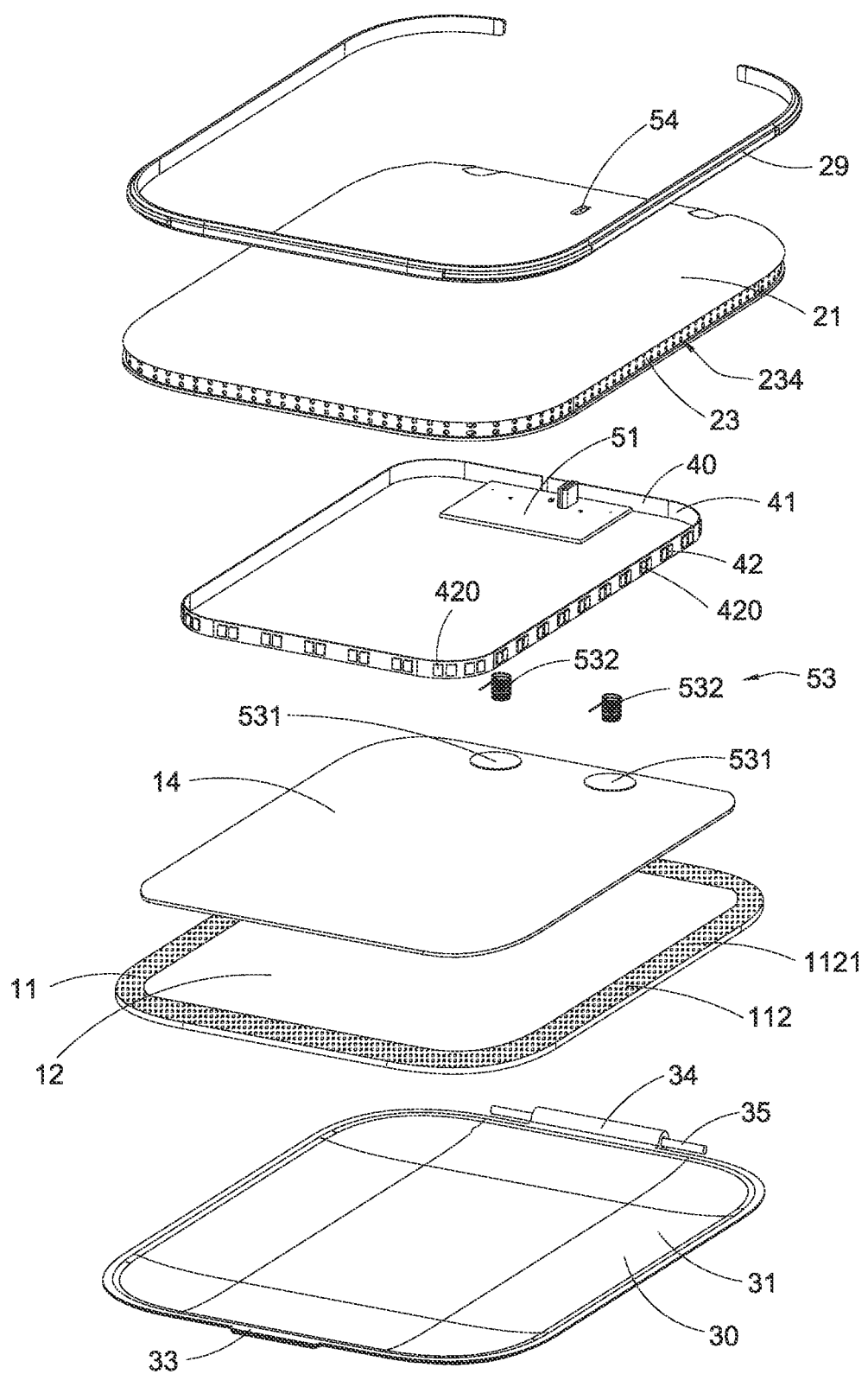
FIG. 19 is an exploded view of the portable light up mirror according to the first alternative mode of the above preferred embodiment of the present invention.
Figure 20:
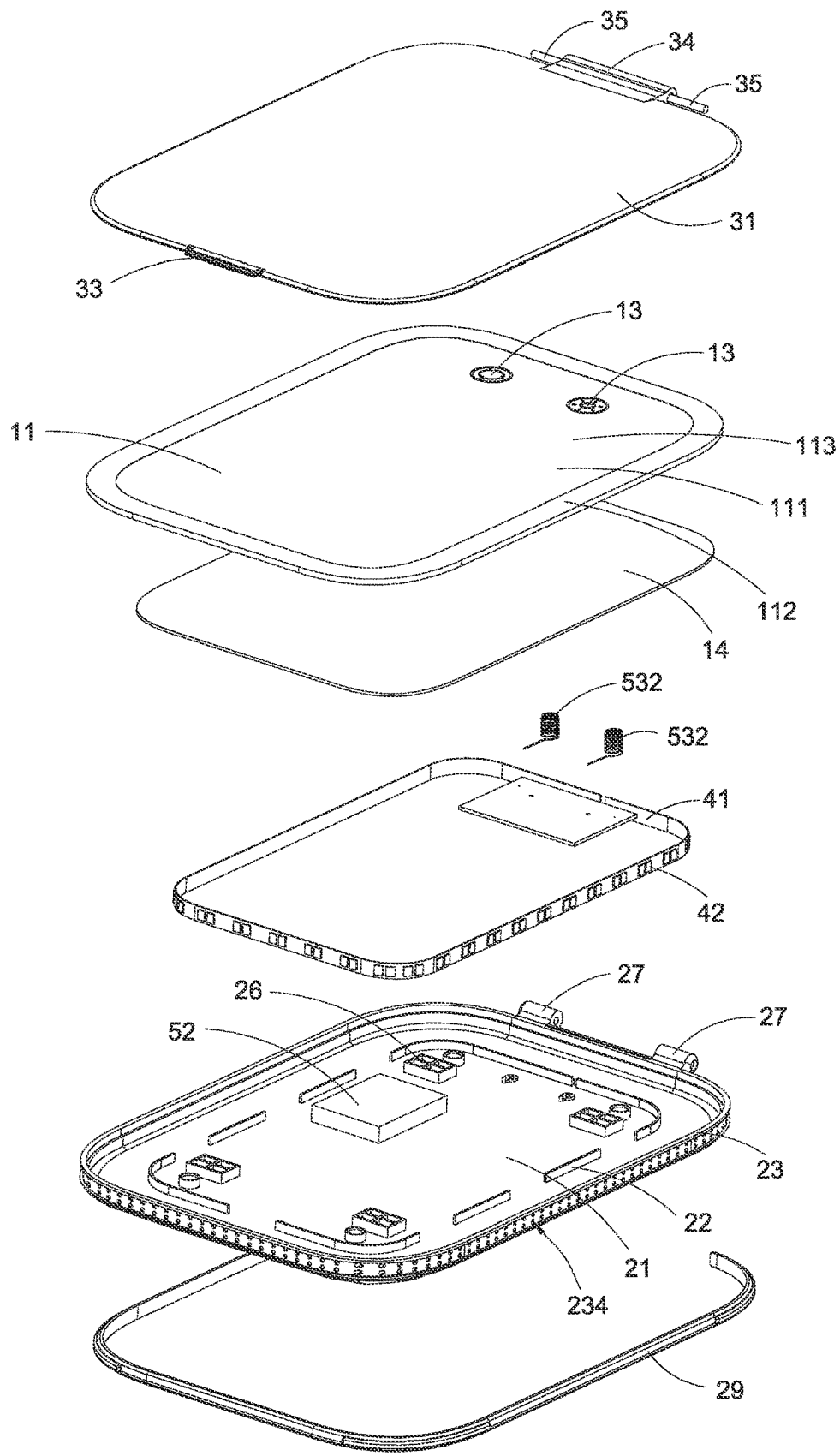
FIG. 20 is another exploded view of the portable light up mirror according to the first alternative mode of the above preferred embodiment of the present invention.

In addition, as shown in FIG. 15 of the drawings, a protection film 16 may be attached to the substrate layer 11 of the mirror element 10 to protect the substrate layer 11.

Referring to FIGS. 16 to 21 of the drawings, a portable light up mirror according to a first alternative mode of the above preferred embodiment of the present invention is illustrated, the portable light up mirror comprises a mirror element 10, a case element 20 for mounting and accommodating the mirror element 10, a cover element 30 coupled with the case element 20 to form a housing for covering and protecting the mirror element 10, a light source 40 for providing illumination to a user's face, and a control unit 50 electrically connected to the light source 40 for controlling the operation of the light source 40.

The case element 20 comprises a base board 21, a mounting frame 22 connected to the base board 21 for supporting the mirror element 10 and a surrounding wall 23 extended from an edge of the base board 21 to define the inner cavity 201. An accommodating groove 202 extending in a ring shape is formed around the mounting frame 22 between the surrounding wall 23 and the base board 21.

In this embodiment, the surrounding wall 23 of the case element 20 has an surrounding groove 234, and the The case element 20 further comprises a resilient frame 29 which is made of resilient material and is disposed into the surrounding groove 234 of the surrounding wall 23 of the case element 20, so as to provide a cushion effect along a perimeter of the case element 20, and thus the mirror element 10 within the case element 20 is protected.

The mirror element 10 comprises a transparent substrate layer 11, and a reflective layer 12 attached to the substrate layer 11, and a reinforcing layer 14 attached to the reflective layer 12. The substrate layer 11 comprises a main body 111 and an edge portion 112, the reflective layer 12 is applied and coated to the back surface of the main body 111, the edge portion 112 of the substrate layer 11 of the mirror element 10 comprises a blasted surface 1121 at an inner side facing the accommodating groove 202 of the case element 20.

The light source 40 comprises an elongated flexible circuit board 41 and a plurality of light emitting elements 42 electrically connected to the flexible circuit board 41. In this example, the light source 40 is disposed in the accommodating groove 202 in a manner that the plurality of light emitting elements 42 is evenly distributed along the entire length of the accommodating groove 202 and is orientated towards the surrounding wall 23 of the case element 20.

In this embodiment, the control unit 50 further comprises a circuit board 51, a rechargeable battery 52 electrically connected to the circuit board 51, and two capacitive sensing element 53 which are respectively electrically connected to the circuit board 51. each capacitive sensing element 53 comprises a sensing layer 531 which can be a cooper foil and a spring 532 abutting the sensing layer 531 and being an electrical conductor electrically connected to the circuit board 52.

Correspondingly, the mirror element 10 comprises two indication patterns 13 achieved through laser etching and formed on the surface of the substrate layer 11 of the mirror element 10 and are respectively aligned with the two capacitive sensing elements 53 to signify two finger touch areas of the mirror element 10 at a front side of the mirror element 10.

When the finger of the user is placed above the two indication patterns 13, different commands can be generated by the circuit board 51 to trigger different operations of the light source 40. For example, the pressing operation of the finger of the user on one of the two indication patterns 13 is able control the on and off the light source 40, and the finger of the user continually placing on the other of the two indication patterns 13 is able control the adjustment of the illumination intensity of the light source 40.

Figure 21:
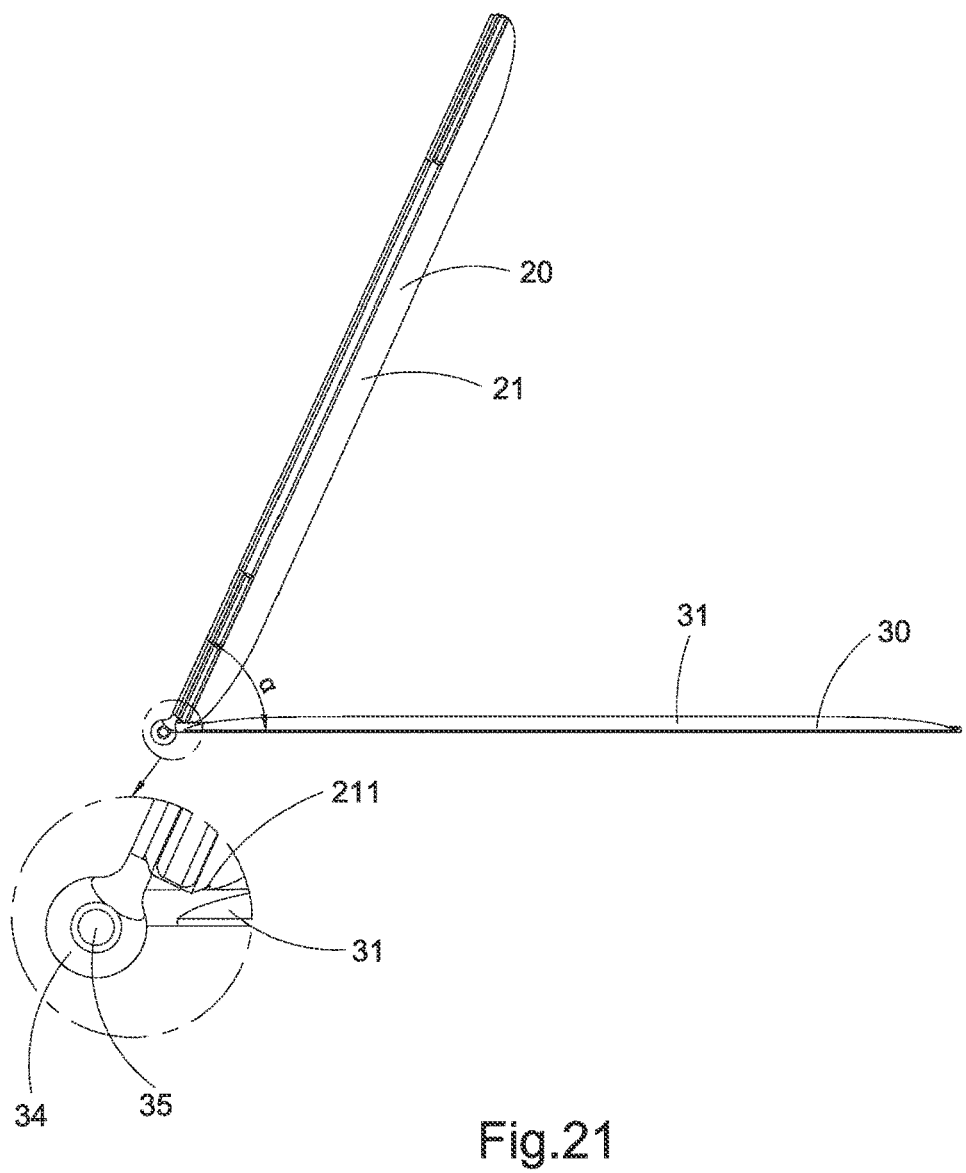
FIG. 21 is a sectional view of the portable light up mirror being in a usage state according to the first alternative mode of the above preferred embodiment of the present invention.

As shown in FIG. 21, the base board 21 of the case element 20 comprises a transverse abutting edge 211 which is bottom edge of the base board 21 when the case element 20 is in the usage state for exposing the mirror element 10. The transverse abutting edge 211 is abutting against the cover element 30 so as to block the further pivotal movement between the case element 20 and the cover element 30, so as to define the included angle $\alpha$ between the case element 20 and the cover element 30.

In addition, in this embodiment, the case element 20 further comprises two pivot bases 27, and the cover element 30 further comprises one pivot arm 34 which is extended between the two pivot bases 27, and two pivot pin 35 are respectively penetrating the pivot arm 34 and the pivot bases 27, so as to pivotally couple the pivot arm 34 with the two pivot bases 27, so that the cover element 30 can be pivotally rotated to move respect to the case element 20.

Figure 22:
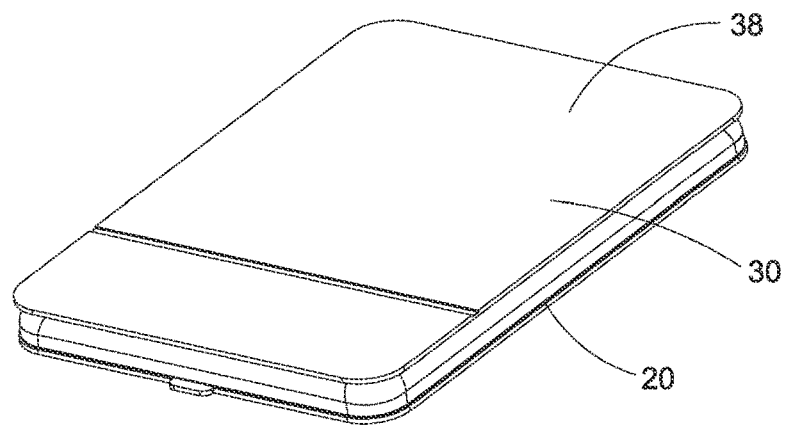
FIG. 22 is a perspective view of a portable light up mirror according to a second alternative mode of the above preferred embodiment of the present invention.
Figure 23:
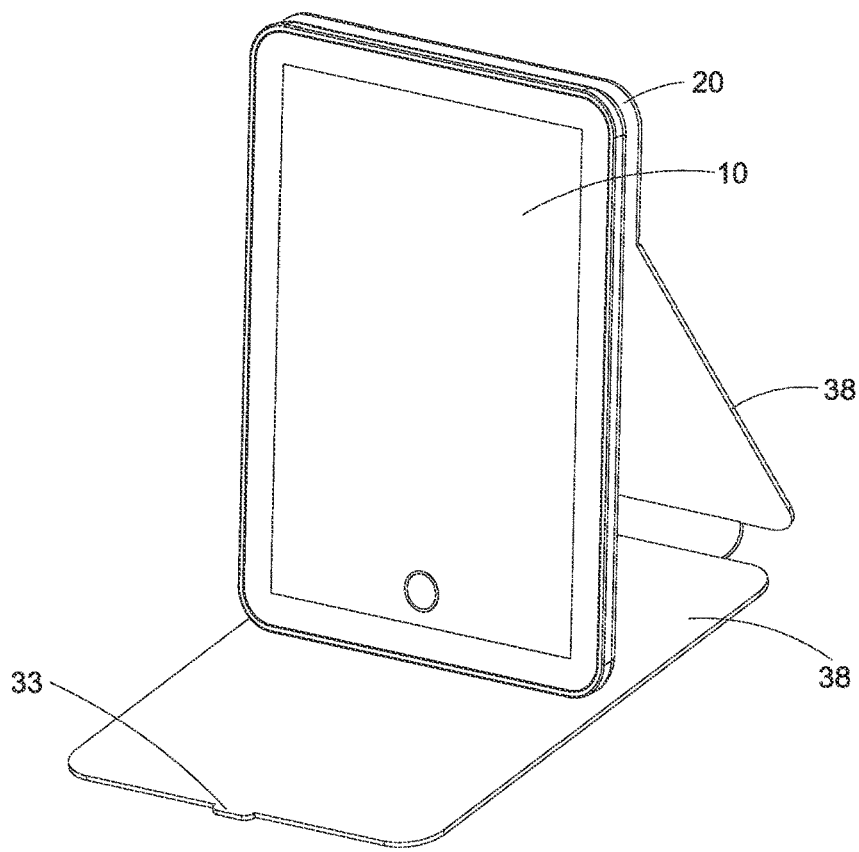
FIG. 23 is a perspective view illustrating the mirror element of the portable light up mirror being supported with an inclination angle according to the second alternative mode of the above preferred embodiment of the present invention.
Figure 24:
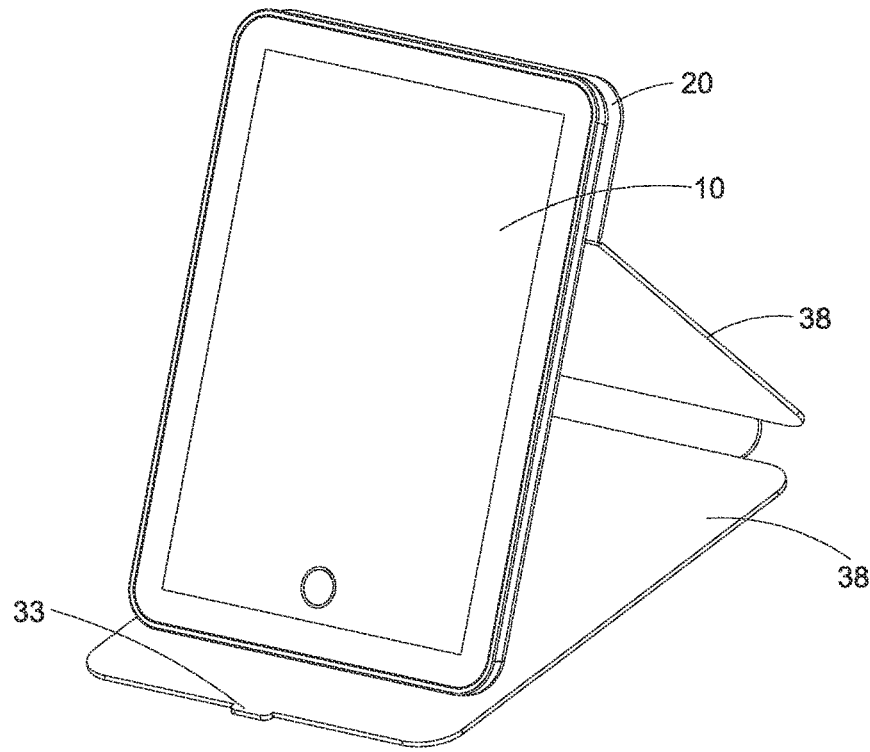
FIG. 24 is a perspective view illustrating the mirror element of the portable light up mirror being supported with another inclination angle according to the second alternative mode of the above preferred embodiment of the present invention.

Referring to FIGS. 22 to 24 of the drawings, a portable light up mirror according to a second alternative mode of the above preferred embodiment of the present invention is illustrated, the portable light up mirror comprises a mirror element 10, a case element 20 for mounting and accommodating the mirror element 10, a cover element 30 coupled with the case element 20 to form a housing for covering and protecting the mirror element 10, the above mentioned light source 40 for providing illumination to a user's face, and the above mentioned control unit 50 electrically connected to the light source 40 for controlling the operation of the light source 40.

In this embodiment, the cover element 30 is attached to the case element 20 by a glue, and the cover element 30 is a foldable cover which comprises a plurality of cover sections 38 such as two cover sections 38 for covering and protecting the case element 20 and the mirror element 10.

In addition, the two cover sections 38 can support the case element 20 and the mirror element 10 at different positions. More specifically, as shown in FIGS. 23 and 24, one cover section 38 can be placed on an environment surface and the case element 20 can be inclinedly supported on the cover section 38 with the other cover section 38 is supported at a back side of the case element 20 in a manner that the two cover sections and the case element 20 can form a stable triangular structure to retain the case element 20 in position, so that the mirror element 10 is allowed to be supported at different positions, so as to provide the user with the flexibility to view his or her reflection from a preferred desired angle.

In addition, the cover section 38 which is covered on the mirror element 10 may be provided with magnetically attracting property so as to magnetically coupled with the case element 20 to ensure the cover element 30 to be firmly attached to the case element 20, preventing accidental detachment and undesired exposure of the mirror element 10.

Figure 25:
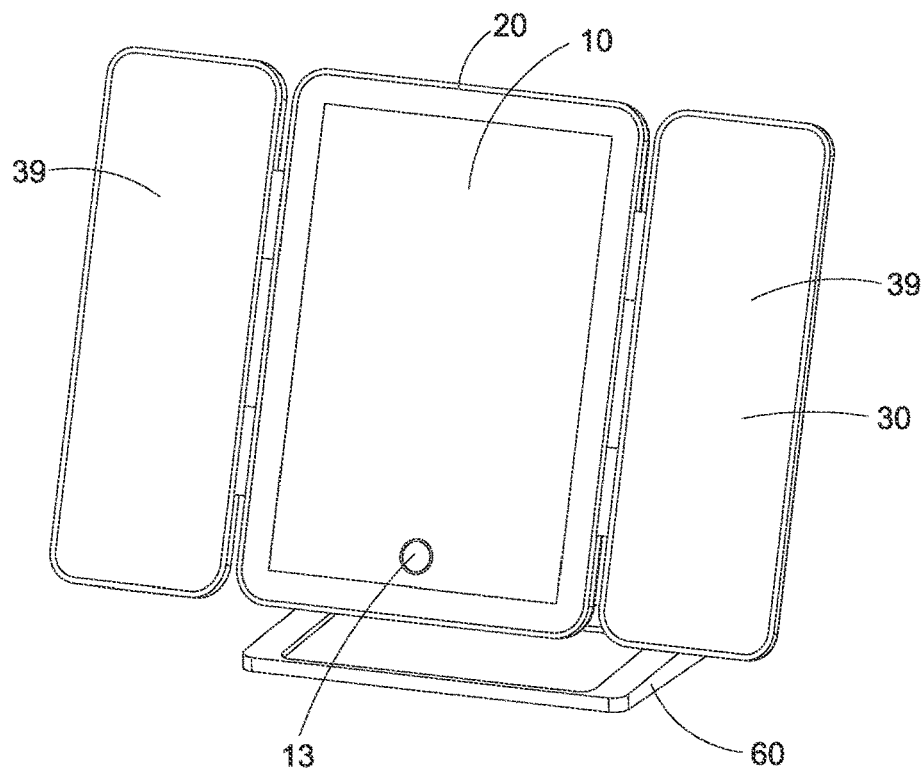
FIG. 25 is a perspective view of a portable light up mirror according to a third alternative mode of the above preferred embodiment of the present invention.
Figure 26:
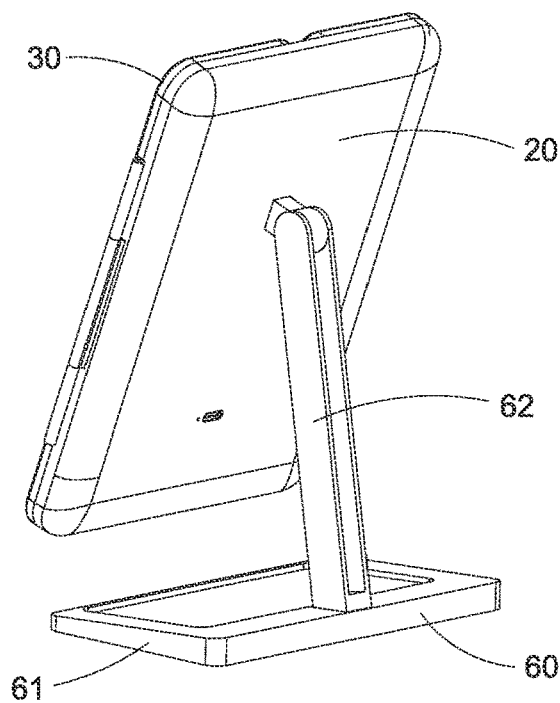
FIG. 26 is another perspective view of a portable light up mirror according to the third alternative mode of the above preferred embodiment of the present invention

Referring to FIGS. 25 and 26 of the drawings, a portable light up mirror according to a third alternative mode of the above preferred embodiment of the present invention is illustrated, the portable light up mirror comprises a mirror element 10, a case element 20 for mounting and accommodating the mirror element 10, a cover element 30 coupled with the case element 20 to form a housing for covering and protecting the mirror element 10, the above mentioned light source 40 for providing illumination to a user's face, the above mentioned control unit 50 electrically connected to the light source 40 for controlling the operation of the light source 40 and a supporting base 60 for movably supporting the case element 20.

The supporting base 60 comprises a standing support 61 and a supporting arm 62 extended from the standing support 61, and the case element 20 is rotatably coupled to the supporting arm 62, so as to adjust an inclination angle of the mirror element 10.

In this embodiment, the mirror element 10 comprises a plurality of magnification mirrors 15 with different magnification levels, and the cover element 30 comprises a plurality of cover members 39 which is respectively pivotally coupled to lateral sides of the case element 20, and the plurality of magnification mirrors 15 is respectively attached to the plurality of cover members 39 at the inner sides of the plurality of cover members 39. For example, two magnification mirrors 15 are respectively mounted to two cover members 39 and can be exposed at two opposite sides of the substrate layer 11 of the main enteral mirror of the mirror element 10.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and are subject to change without departure from such principles. Therefore, this invention includes all modifications encompassed within the spirit and scope of the following claims.

What is claimed is:

1. A portable light up mirror, comprising:
a mirror element;
a case element, wherein said mirror element is mounted in said case element;
a cover element which is coupled with said case element for covering said mirror element;
a light source which is arranged behind said mirror element within said case element, wherein said mirror element comprises a substrate layer and a reflective layer, wherein said substrate layer is a transparent layer comprising a maid body and an edge portion integrally extended from said main body to surround said main body, wherein said reflective layer is attached to said substrate layer, wherein said edge portion of said substrate layer comprises a blasted surface for diffusing light beams from said light source, wherein said case element comprises a base board, a mounting frame connected to said base board, and a surrounding wall connected to said base board, wherein an accommodating groove is formed between said mounting frame and said surrounding wall, wherein said light source comprises a flexible circuit board and a plurality of light emitting elements attached on said flexible circuit board, wherein said flexible circuit board and said plurality of light emitting elements are disposed in said accommodating groove, wherein each of said light emitting elements comprises a light emitting surface oriented toward said surrounding wall of said case element and a side edge oriented toward said mirror element, so as to allow light beams from each said light emitting element to project onto said surrounding wall of said case element and then are reflected by said surrounding wall towards said edge portion of said substrate layer of said mirror element, wherein said reflective layer comprises a peripheral edge which is extended to a position above said accommodating groove in a manner that said plurality of light emitting elements are covered by said peripheral edge of said reflective layer, so as to hide said light emitting elements behind said peripheral edge of said reflective layer; and
a control unit which is electrically connected to said light source to control operation of said light source, wherein said control unit comprise a circuit board which is integrated with a capacitive touch controller chip, and a capacitive sensing element which is electrically connected to said capacitive touch controller chip to detect a finger touch of a user;
wherein said capacitive sensing element comprises an sensing layer attached to said mirror element and a spring abutting against said sensing layer, wherein said spring is an electrical conductor that is electrically connected to said circuit board, wherein said case element comprises a mounting pin which is extended from said base board, and said spring is wound around said mounting pin in a manner that said mounting pin retains said spring in position.

2. The portable light up mirror, as recited in claim 1, wherein said sensing layer is a round copper foil that is attached to a back side of said mirror element, wherein a diameter of said sensing layer is larger than a diameter of said spring, wherein when a finger of the user approaches said mirror element at a position corresponding to said sensing layer, the finger disrupts electromagnetic field around said capacitive sensing element and cause a change in capacitance, and this change is detected by said capacitive touch controller chip, so as to trigger an operation of said light source from one of activating said light source, turning off said light source and adjusting illumination intensity of said light source.

3. A portable light up mirror, comprising:
a mirror element;
a case element, wherein said mirror element is mounted in said case element;
a cover element which is coupled with said case element for covering said mirror element;
a light source which is arranged behind said mirror element within said case element, wherein said mirror element comprises a substrate layer and a reflective layer, wherein said substrate layer is a transparent layer comprising a maid body and an edge portion integrally extended from said main body to surround said main body, wherein said reflective layer is attached to said substrate layer, wherein said edge portion of said substrate layer comprises a blasted surface for diffusing light beams from said light source, wherein said case element comprises a base board, a mounting frame connected to said base board, and a surrounding wall connected to said base board, wherein an accommodating groove is formed between said mounting frame and said surrounding wall, wherein said light source comprises a flexible circuit board and a plurality of light emitting elements attached on said flexible circuit board, wherein said flexible circuit board and said plurality of light emitting elements are disposed in said accommodating groove, wherein each of said light emitting elements comprises a light emitting surface oriented toward said surrounding wall of said case element and a side edge oriented toward said mirror element, so as to allow light beams from each said light emitting element to project onto said surrounding wall of said case element and then are reflected by said surrounding wall towards said edge portion of said substrate layer of said mirror element, wherein said reflective layer comprises a peripheral edge which is extended to a position above said accommodating groove in a manner that said plurality of light emitting elements are covered by said peripheral edge of said reflective layer, so as to hide said light emitting elements behind said peripheral edge of said reflective layer; and a control unit which is electrically connected to said light source to control operation of said light source, wherein said control unit comprise a circuit board which is integrated with a capacitive touch controller chip, and a capacitive sensing element which is electrically connected to said capacitive touch controller chip to detect a finger touch of a user;

wherein said mirror element comprises a substrate layer, a reflective layer attached to said substrate layer, and an indication pattern which is distinguishable from said substrate layer and achieved through laser etching a glass material of said substrate, so as to be aligned with said capacitive sensing element to signify a finger touch area of said mirror element, wherein said reflective layer is positioned between said capacitive sensing element and said indication pattern.

* * * * *